(12) United States Patent
Lee et al.

(10) Patent No.: US 12,477,931 B2
(45) Date of Patent: Nov. 18, 2025

(54) DISPLAY DEVICE INCLUDING PROTECTIVE MEMBER

(71) Applicant: SAMSUNG DISPLAY CO., LTD., Yongin-si (KR)

(72) Inventors: Jung Kyu Lee, Incheon (KR); Sung Kook Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 628 days.

(21) Appl. No.: 17/889,459

(22) Filed: Aug. 17, 2022

(65) Prior Publication Data

US 2023/0217686 A1 Jul. 6, 2023

(51) Int. Cl.
*H10K 50/84* (2023.01)
*H10K 50/844* (2023.01)

(52) U.S. Cl.
CPC .................................. *H10K 50/844* (2023.02)

(58) Field of Classification Search
CPC .. H10K 50/844; H10K 50/841; H10K 59/873; H10H 29/142; H10H 20/852; G09F 9/301; G09F 9/33; G09F 9/335
See application file for complete search history.

(56) References Cited

U.S. PATENT DOCUMENTS

| 8,766,273 | B2 | 7/2014 | Otsuki et al. |
| 9,923,170 | B2 | 3/2018 | Kim et al. |
| 10,673,016 | B2 | 6/2020 | Kwon et al. |
| 11,334,117 | B2 | 5/2022 | Youn et al. |
| 11,599,213 | B2 * | 3/2023 | Joo ........................ G06F 3/0446 |
| 11,621,308 | B2 * | 4/2023 | Seo ....................... H10K 71/135 |
| | | | 345/174 |
| 12,019,819 | B2 | 6/2024 | Joo et al. |
| 12,174,665 | B2 | 12/2024 | Youn et al. |
| 12,310,175 | B2 * | 5/2025 | Park ...................... H10K 71/851 |
| 2016/0028043 | A1 | 1/2016 | Kwon et al. |
| 2019/0269011 | A1 * | 8/2019 | Lee ....................... H05K 3/0014 |

(Continued)

FOREIGN PATENT DOCUMENTS

| CN | 108766977 B * | 4/2021 | ............. G09F 9/301 |
| JP | 2015-184461 A2 | 10/2015 | |

(Continued)

OTHER PUBLICATIONS

Office Action issued in corresponding Application No. KR 10-2021-0192284 on Apr. 30, 2025.

*Primary Examiner* — Ida M Soward
(74) *Attorney, Agent, or Firm* — F. CHAU & ASSOCIATES, LLC

(57) ABSTRACT

A display device includes a display panel. A protective member is disposed below the display panel. A first adhesive layer is disposed on an upper surface of the protective member. The first adhesive layer includes a first coupling composition. A second adhesive layer is at least partially disposed between an upper surface of the first adhesive layer and a lower surface of the display panel. The second adhesive layer includes a second coupling composition different from the first coupling composition. The second adhesive layer has a creep characteristic greater than that of the first adhesive layer. An adhesive force of the first coupling composition to the protective member is greater than an adhesive force of the second coupling composition to the protective member.

20 Claims, 14 Drawing Sheets

(56) References Cited

U.S. PATENT DOCUMENTS

| | | | |
|---|---|---|---|
| 2020/0170126 A1* | 5/2020 | Ahn | H10K 59/353 |
| 2020/0342816 A1* | 10/2020 | Bok | G09G 3/32 |
| 2021/0318770 A1* | 10/2021 | Joo | G06F 3/04164 |
| 2021/0319756 A1* | 10/2021 | Kim | G09G 3/3233 |
| 2021/0376006 A1* | 12/2021 | Won | H10K 77/10 |
| 2022/0005877 A1* | 1/2022 | Seo | H10K 50/844 |
| 2022/0036810 A1* | 2/2022 | Gu | G06T 7/11 |
| 2022/0093897 A1* | 3/2022 | Lee | H10K 59/12 |
| 2022/0102462 A1* | 3/2022 | Zhou | H10K 59/1201 |
| 2022/0123256 A1* | 4/2022 | Hyun | H10K 50/844 |
| 2022/0165805 A1* | 5/2022 | Choi | H10K 71/00 |
| 2023/0026482 A1* | 1/2023 | Wang | G06F 1/1652 |
| 2024/0319812 A1 | 9/2024 | Joo et al. | |

FOREIGN PATENT DOCUMENTS

| | | | | |
|---|---|---|---|---|
| KR | 10-1409050 B1 | 6/2014 | | |
| KR | 10-2016-0013489 A | 2/2016 | | |
| KR | 10-2016-0055333 A | 5/2016 | | |
| KR | 10-2019-0102123 | 9/2019 | | |
| KR | 10-2076285 | 2/2020 | | |
| KR | 10-2020-0063379 | 6/2020 | | |
| KR | 10-2020-0069799 A | 6/2020 | | |
| KR | 10-2020-0145934 | 12/2020 | | |
| KR | 20210028783 A | * 3/2021 | | H10K 59/8722 |
| KR | 10-2021-0127281 A | 10/2021 | | |
| KR | 20210127283 A | * 10/2021 | | G09G 3/3266 |
| KR | 20210145873 A | * 12/2021 | | C23C 14/12 |
| KR | 20210151634 A | * 12/2021 | | H10K 59/131 |

* cited by examiner

DISPLAY DEVICE INCLUDING PROTECTIVE MEMBER

CROSS-REFERENCE TO RELATED APPLICATION

This application claims priority under 35 U.S.C. § 119 to Korean Patent Application No. 10-2021-0192284, filed on Dec. 30, 2021 in the Korean Intellectual Property Office, the disclosure of which is incorporated by reference in its entirety herein.

TECHNICAL FIELD

The present disclosure relates to a display device.

DISCUSSION OF RELATED ART

The demand for a display device for displaying an image that is applied to various different types of electronic devices has increased along with the advancement of the information age. For example, display devices have been applied to various electronic devices such as a smart phone, a digital camera, a laptop computer, a navigator and a smart television.

The display device may be a flat panel display device such as a liquid crystal display device, a field emission display device and a light emitting display device. The light emitting display device includes an organic light emitting display device that includes an organic light emitting diode, an inorganic light emitting display device that includes an inorganic light emitting diode such as an inorganic semiconductor, and a micro light emitting display device that includes a micro light emitting diode.

As the display device is applied to various electronic devices, the display device should have various different designs. For example, in an embodiment in which the display device is a light emitting display device, an image may be displayed not only on a front portion but also on a side portion bent at each of four side edges of the front portion. For example, the display device may include a corner portion disposed between a first side portion bent at a first side edge of the front portion and a second side portion bent at a second side edge of the front portion. In this case, high strain may be applied to the corner portion due to a double curvature based on a curvature of the first side portion and a curvature of the second side portion. The corner portion may include cut-out portions and a protruding pattern portion to reduce high stress.

SUMMARY

An aspect of embodiments of the present disclosure is to provide a display device comprising a corner portion in a simple structure to prevent a lifting or unfilled defect of a cut-out portion of the corner portion from occurring.

The aspects of the present disclosure are not limited to those mentioned above and additional objects of the present disclosure, which are not mentioned herein, will be clearly understood by those skilled in the art from the following description of embodiments of the present disclosure.

According to an embodiment of the disclosure, a display device includes a display panel. A protective member is disposed below the display panel. A first adhesive layer is disposed on an upper surface of the protective member. The first adhesive layer includes a first coupling composition. A second adhesive layer is at least partially disposed between an upper surface of the first adhesive layer and a lower surface of the display panel. The second adhesive layer includes a second coupling composition different from the first coupling composition. The second adhesive layer has a creep characteristic greater than that of the first adhesive layer. An adhesive force of the first coupling composition to the protective member is greater than an adhesive force of the second coupling composition to the protective member.

In an embodiment, the display panel may include a first display area, a second display area disposed to surround the first display area, and a third display area including a plurality of protruding patterns disposed to be outwardly protruded from the second display area at a corner portion of the display device and a cut-out portion that is a space between the plurality of protruding patterns, and the second adhesive layer includes a base portion disposed between the upper surface of the first adhesive layer and the lower surface of the display panel and a protruding portion connected from the base portion and protruded towards an upper side of the plurality of protruding patterns and passing through the cut-out portion.

In an embodiment, the display device may further comprise a third adhesive layer disposed on an upper surface of the display panel.

In an embodiment, an upper end of the protruding portion may be at least partially in direct contact with the third adhesive layer.

In an embodiment, the third adhesive layer may include a third coupling composition that comprises a same material as the second coupling composition.

In an embodiment, the display device may further comprise a cover window disposed on an upper surface of the third adhesive layer.

In an embodiment, the plurality of protruding patterns may be separated from each other with the cut-out portion interposed therebetween.

In an embodiment, a first side of a first protruding pattern that faces the cut-out portion among the plurality of protruding patterns may be in direct contact with a first side of the protruding portion.

In an embodiment, the first side of the first protruding pattern and the first side of the protruding portion have shapes that are complementary to each other.

In an embodiment, a first side of a first protruding pattern that faces the cut-out portion among the plurality of protruding patterns has a forward tapered shape, and a first side of the protruding portion may have a reverse tapered shape.

In an embodiment, the protective member may include polydimethylsiloxane.

In an embodiment, the first adhesive layer may include a silicon-based optical transparent adhesive and the second adhesive layer includes an acrylic optical transparent adhesive, and the second adhesive layer has a modulus in a range of about 0.2 Mpa to about 0.3 Mpa and a creep characteristic in a range of about 10% to about 40%.

In an embodiment, the display device may further comprise a barrier layer disposed between the upper surface of the protective member and a lower surface of the second adhesive layer or on a lower surface of the protective member.

According to an embodiment of the present disclosure, a display device comprises a display panel including a first display area, a second display area disposed to surround the first display area, and a third display area including a plurality of protruding patterns disposed to be outwardly protruded from the second display area at a corner portion of the display device and a cut-out portion that is a space between the plurality of protruding patterns; a protective member disposed on a lower surface of the display panel; a first adhesive layer disposed on an upper surface of the protective member; a second adhesive layer disposed inside the cut-out portion; a third adhesive layer disposed on an upper surface of the display panel; and a cover window disposed on an upper surface of the third adhesive layer, wherein the second adhesive layer is in direct contact with an upper surface of the first adhesive layer, sides of the plurality of protruding patterns and a lower surface of the third adhesive layer.

In an embodiment, the protective member may include polydimethylsiloxane, the first adhesive layer includes a silicon-based optical transparent adhesive, and the second adhesive layer includes an optical transparent resin.

In an embodiment, the second adhesive layer may fill at least about 80% of the space formed by the cut-out portion.

In an embodiment, the display device may further comprise a barrier layer disposed on the lower surface of the display panel.

According to an embodiment of the disclosure, a display device comprises a display panel including a first display area, a second display area disposed to surround the first display area, and a third display area including a plurality of protruding patterns disposed to be outwardly protruded from the second display area at a corner portion of the display device and a cut-out portion that is a space between the plurality of protruding patterns; a protective member disposed on a lower surface of the display panel; a first adhesive layer disposed on an upper surface of the protective member; a second adhesive layer disposed on upper surfaces of the cut-out portion and the plurality of protruding patterns; a third adhesive layer disposed on an upper surface of the second adhesive layer; and a cover window disposed on an upper surface of the third adhesive layer, wherein the second adhesive layer is in direct contact with an upper surface of the first adhesive layer, upper surfaces and sides of the protruding patterns and a lower surface of the third adhesive layer.

In an embodiment, the second adhesive layer may include a base portion having a flat shape, disposed between the third adhesive layer and the plurality of protruding patterns, and a protruding portion disposed inside the cut-out portion, the base portion and the protruding portion are integrally formed without a separate interface, an adhesive layer disposed between the cover window and the display panel is comprised of a double layer of the base portion and the third adhesive layer, and a first side of a first protruding pattern that faces the cut-out portion among the plurality of protruding patterns and a first side of the protruding portion that is in direct contact with the first side of the first protruding pattern have shapes that are complementary to each other.

In an embodiment, the protective member may include polydimethylsiloxane, the first adhesive layer includes a silicon-based optical transparent adhesive, and the second adhesive layer includes an optical transparent resin.

In the display device according to embodiments of the present disclosure, an adhesive layer may fill a space formed by a cut-out portion without a gap, whereby a lifting or unfilled defect of the cut-out portion may be avoided. As a result, an adhesive force of a protruding pattern may be secured and visibility of the display device may be increased.

The effects according to embodiments of the present disclosure are not limited to those mentioned above and more various effects are included in the following description of embodiments of the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

The present disclosure will now be described more fully hereinafter with reference to the accompanying drawings, in which embodiments of the present disclosure are shown. This present disclosure may, however, be embodied in different forms and should not be construed as limited to embodiments set forth herein.

It will also be understood that when a layer is referred to as being "on" another layer or substrate, it can be directly on the other layer or substrate, or intervening layers may also be present. When a layer is referred to as being "directly on" another layer or substrate, no intervening layers may be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings.

Figure 1:
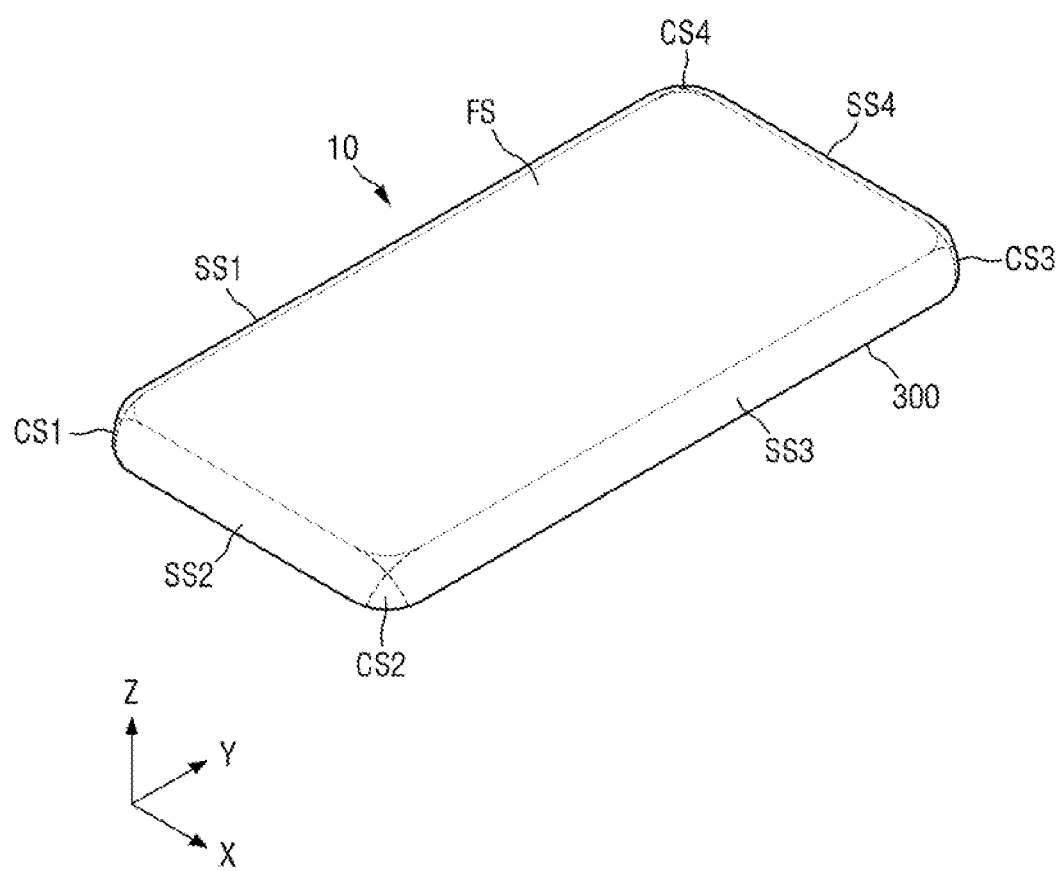
FIG. 1 is a perspective view illustrating a display device according to an embodiment of the present disclosure.
Figure 2:
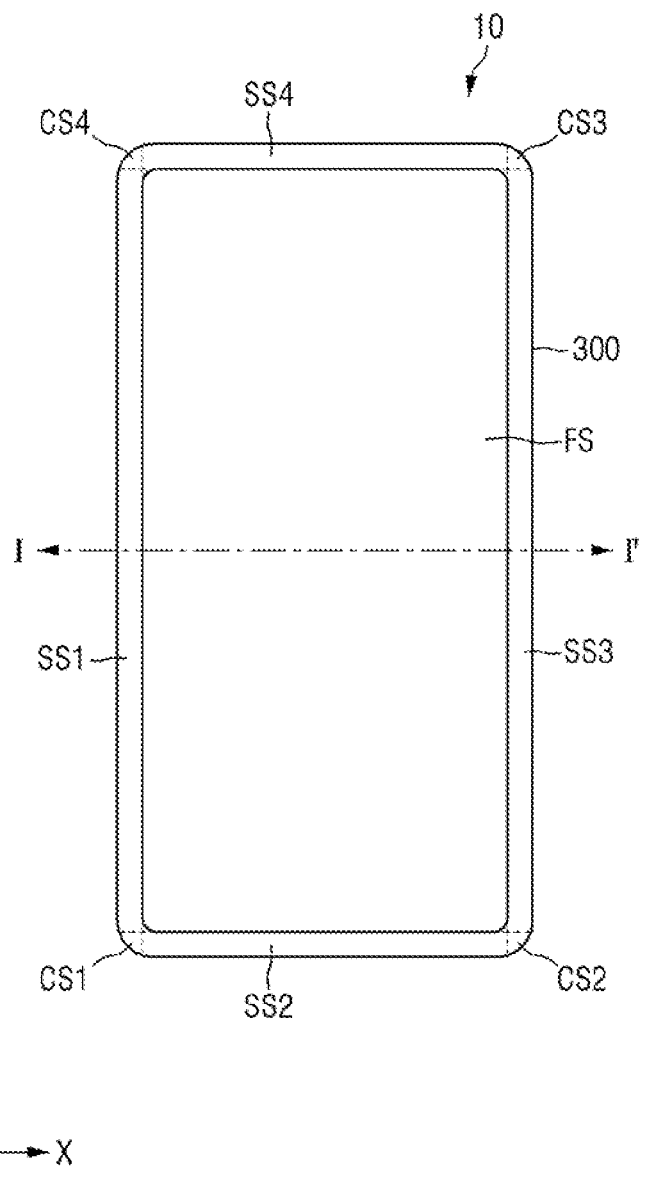
FIG. 2 is a plan view illustrating a display device according to an embodiment of the present disclosure.

FIG. 1 is a perspective view illustrating a display device according to an embodiment. FIG. 2 is a plan view illustrating a display device according to an embodiment.

Referring to FIGS. 1 and 2, a display device 10 according to an embodiment may be applied to a portable electronic device such as a mobile phone, a smart phone, a tablet personal computer (PC), a mobile communication terminal, an electronic diary, an electronic book, a portable multimedia player (PMP), a navigator and an ultra mobile PC (UMPC). In an embodiment, the display device 10 may be applied to a television, a laptop computer, a monitor, a signboard or a display unit of Internet of things (IoT). In an embodiment, the display device 10 may be applied to a wearable device such as a smart watch, a watch phone, an eyeglasses-type display and a head mounted display (HMD). In an embodiment, the display device 10 may be applied to a dashboard of a vehicle, a center fascia of a vehicle, a center information display (CID) disposed on a dashboard of a vehicle, a room mirror display that replaces a side mirror of a vehicle or a display disposed on a rear surface of a front seat as an entertainment for a rear seat of a vehicle. However, embodiments of the present disclosure are not necessarily limited thereto.

In the present disclosure, a first direction (X-axis direction) is a direction parallel with a short side of the display device 10 on a plane, and for example, may be a horizontal direction of the display device 10. A second direction (Y-axis direction) is a direction parallel with a long side of the display device 10 on a plane, and for example, may be a vertical direction of the display device 10. A third direction (Z-axis direction) may be a thickness direction of the display device 10.

The display device 10 according to an embodiment may include a display panel 300. As shown in FIGS. 1 and 2, the display panel 300 may include a front portion FS, a first side portion SS1, a second side portion SS2, a third side portion SS3, a fourth side portion SS4, a first corner portion CS1, a second corner portion CS2, a third corner portion CS3, and a fourth corner portion CS4.

In an embodiment, the display panel 300 may include a flexible substrate SUB capable of being subjected to bending, folding, rolling, etc. For example, the substrate SUB may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate SUB may include a metal material. Also, the substrate SUB may be partially flexible, or may be fully flexible.

The front portion FS may have a rectangular planar shape with a short side in the first direction (X-axis direction) and a long side in the second direction (Y-axis direction), but is not necessarily limited thereto. The front portion FS may have other polygonal, circular or oval planar shape. In FIGS. 1 and 2, the front portion FS is formed to be flat, but is not necessarily limited thereto. The front portion FS may include a curved surface.

The first side portion SS1 may be extended from a first side of the front portion FS. The first side portion SS1 is bent along a first bending line (BL1 of FIG. 3) of the first side of the front portion FS, and thus may have a first curvature. The first side of the front portion FS may be a left side of the front portion FS as shown in FIGS. 1 and 2.

The second side portion SS2 may be extended from a second side of the front portion FS. The second side portion SS2 is bent along a second bending line (BL2 of FIG. 3) of the second side of the front portion FS, and thus may have a second curvature. In an embodiment, the second curvature may be different from the first curvature, but is not necessarily limited thereto. The second side of the front portion FS may be a lower side of the front portion FS as shown in FIGS. 1 and 2.

The third side portion SS3 may be extended from a third side of the front portion FS. The third side portion SS3 is bent along a third bending line (BL3 of FIG. 3) of the third side of the front portion FS, and thus may have a third curvature. In an embodiment, the third curvature may be the same as the second curvature, but is not necessarily limited thereto. The third side of the front portion FS may be a right side of the front portion FS as shown in FIGS. 1 and 2.

The fourth side portion SS4 may be extended from a fourth side of the front portion FS. The fourth side portion SS4 is bent along a fourth bending line (BL4 of FIG. 3) of the fourth side of the front portion FS, and thus may have a fourth curvature. In an embodiment, the fourth curvature may be the same as the first curvature, but is not necessarily limited thereto. The fourth side of the front portion FS may be an upper side of the front portion FS as shown in FIGS. 1 and 2.

The first corner portion CS1 may be disposed between the first side portion SS1 and the second side portion SS2. For example, the first corner portion CS1 may adjoin a lower side of the first side portion SS1 and a left side of the second side portion SS2. The first corner portion CS1 may be a double curvature area bent by the first curvature of the first side portion SS1 and the second curvature of the second side portion SS2. For this reason, a force bent by the first curvature of the first side portion SS1 and a force bent by the second curvature of the second side portion SS2, that is, strain may be applied to the first corner portion CS1.

The second corner portion CS2 may be disposed between the second side portion SS2 and the third side portion SS3. For example, the second corner portion CS2 may adjoin a right side of the second side portion SS2 and a lower side of third side portion SS3. The second corner portion CS2 may be a double curvature area bent by the second curvature of the second side portion SS2 and the third curvature of the third side portion SS3. For this reason, a force bent by the second curvature of the second side portion SS2 and strain bent by the third curvature of the third side portion SS3 may be applied to the second corner portion CS2.

The third corner portion CS3 may be disposed between the third side portion SS3 and the fourth side portion SS4. For example, the third corner portion CS3 may adjoin an upper side of the third side portion SS3 and a right side of the fourth side portion SS4. The third corner portion CS3 may be a double curvature area bent by the third curvature of the third side portion SS3 and the fourth curvature of the fourth side portion SS4. For this reason, a force bent by the third curvature of the third side portion SS3 and strain bent by the fourth curvature of the fourth side portion SS4 may be applied to the third corner portion CS3.

The fourth corner portion CS4 may be disposed between the first side portion SS1 and the fourth side portion SS4. For example, the fourth corner portion CS4 may adjoin an upper side of the first side portion SS1 and a left side of the fourth side portion SS4. The fourth corner portion CS4 may be a double curvature area bent by the first curvature of the first side portion SS1 and the fourth curvature of the fourth side portion SS4. For this reason, a force bent by the first curvature of the first side portion SS1 and strain bent by the fourth curvature of the fourth side portion SS4 may be applied to the fourth corner portion CS4.

In an embodiment, each of the first corner portion CS1, the second corner portion CS2, the third corner portion CS3 and the fourth corner portion CS4 may include protruding patterns CP partitioned by cut-out portions CG to reduce strain applied to a third display area DA3 by a double curvature. The protruding patterns CP will be described later with reference to FIG. 11.

Figure 3:
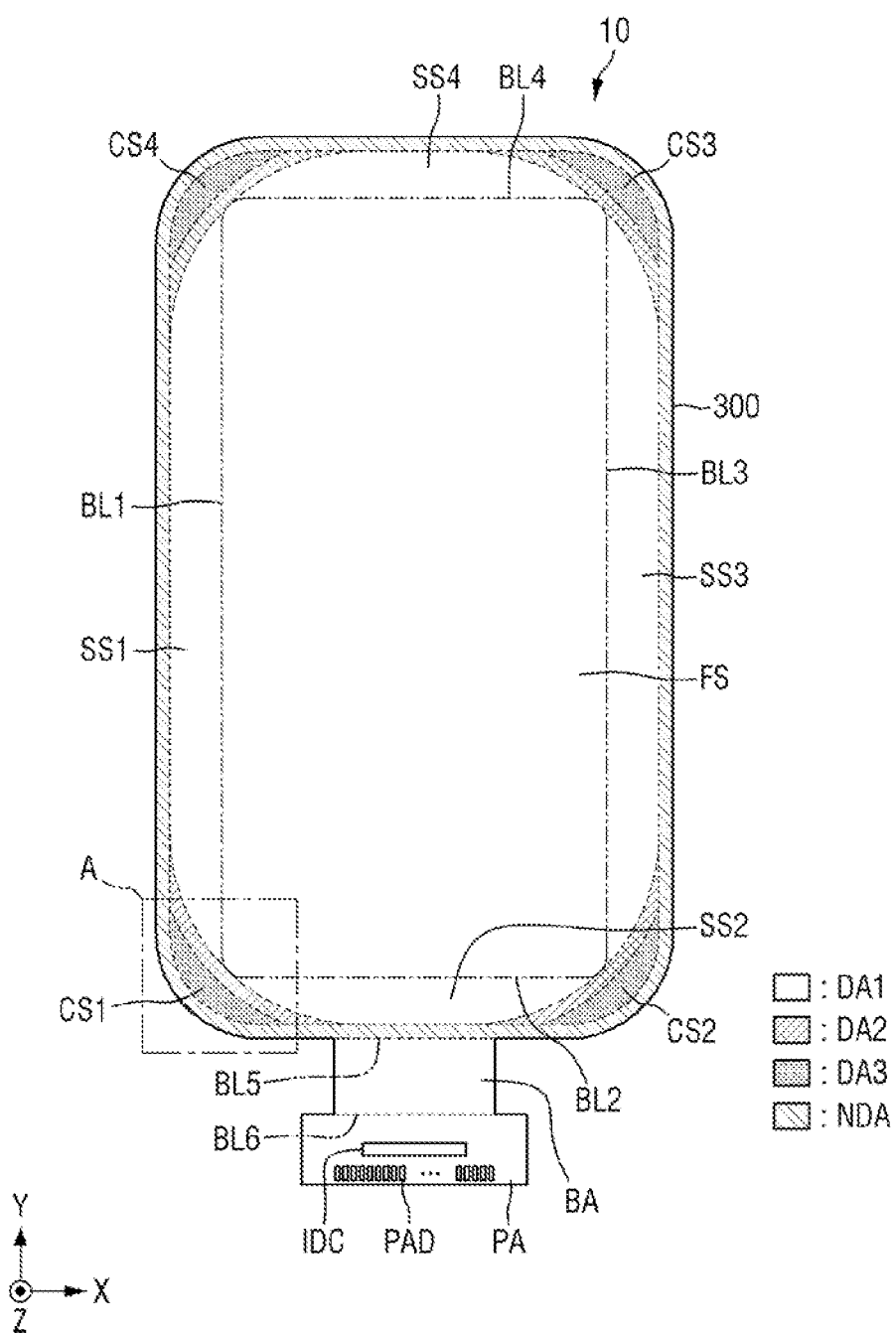
FIG. 3 is a plan view illustrating a display device according to an embodiment of the present disclosure.

FIG. 3 is a plan view illustrating a display device according to an embodiment.

Referring to FIG. 3, the display panel 300 may further include a bending area BA and a pad area PA. In an embodiment, the display panel 300 may include first to third display areas DA1 to DA3, a non-display area NDA, a bending area BA and a pad area PA.

The first to third display areas DA1 to DA3 refer to areas that include pixels or light emission areas to display an image. The non-display area NDA refers to an area that does not include pixels or light emission areas and thus does not display an image. Signal lines or panel embedded driving circuits for driving the pixels or light emission areas may be disposed in the non-display area NDA.

The first display area DA1 is a main display area of the display panel 300, and may include a front portion FS, a portion of the first side portion SS1, a portion of the second side portion SS2, a portion of the third side portion SS3 and a portion of the fourth side portion SS4. A portion of the first side portion SS1 refers to an area extended from the first side of the front portion FS, and a portion of the second side portion SS2 refers to an area extended from the second side of the front portion FS. A portion of the third side portion SS3 refers to an area extended from the third side of the front portion FS, and a portion of the fourth side portion SS4 refers to an area extended from the fourth side of the front portion FS. Each of corners of the first display area DA1 may be rounded with a predetermined curvature.

Each of the third display areas DA3 may be a second auxiliary display area for assisting the first display area DA1 that is a main display area. Resolution of each of the third display areas DA3 may be different from that of the first display area DA1. For example, since each of the third display areas DA3 serves to assist the first display area DA1, resolution of each of the third display areas DA3 may be lower than that of the first display area DA1. For example, the number of third light emission areas per unit area in each of the third display areas DA3 may be less than the number of first light emission areas per unit area in the first display area DA1, but embodiments of the present disclosure are not necessarily limited thereto. For example, in an embodiment, the resolution of each of the third display areas DA3 may be substantially the same as that of the first display area DA1.

Each of the third display areas DA3 may be disposed outside the second display area DA2. Therefore, each of the second display areas DA2 may be disposed between the first display area DA1 and the third display area DA3. At least a portion of each of the third display areas DA3 may be disposed in any one of the corner portions CS1 to CS4. Also, in an embodiment at least a portion of each of the third display areas DA3 may be disposed on any two of the first to fourth side portions SS1 to SS4.

For example, at least a portion of the third display area DA3 disposed outside a corner where a lower side and a left side of the first display area DA1 meet may be disposed on the first corner portion CS1, the first side portion SS1 and the second side portion SS2. At least a portion of the third display area DA3 disposed outside a corner where a lower side and the right side of the first display area DA1 meet may be disposed on the second corner portion CS2, the second side portion SS2 and the third side portion SS3. At least a portion of the third display area DA3 disposed outside a corner where the upper side and a right side of the first display area DA1 meet may be disposed on the third corner portion CS3, the third side portion SS3 and the fourth side portion SS4. At least a portion of the third display area DA3 disposed outside a corner where the upper side and the left side of the first display area DA1 meet may be disposed on the fourth corner portion CS4, the first side portion SS1 and the fourth side portion SS4.

Each of the second display areas DA2 may be a second auxiliary display area for assisting the first display area DA1 that is a main display area. In an embodiment, resolution of each of the second display areas DA2 may be different from that of the first display area DA1. For example, since each of the second display areas DA2 serves to assist the first display area DA1, resolution of each of the second display areas DA2 may be lower than that of the first display area DA1. For example, the number of second light emission areas per unit area in each of the second display areas DA2 may be less than the number of first light emission areas per unit area in the first display area DA1, but embodiments of the present disclosure are not necessarily limited thereto. The resolution of each of the second display areas DA2 may be substantially the same as that of the first display area DA1.

Each of the second display areas DA2 may be disposed outside any one of corners of the first display area DA1. At least a portion of each of the second display areas DA2 may be disposed on any one of the corner portions CS1 to CS4. Also, at least a portion of each of the second display areas DA2 may be disposed on any two of the first to fourth side portions SS1 to SS4.

For example, at least a portion of the second display area DA2 disposed outside the corner where the lower side and the left side of the first display area DA1 meet may be disposed on the first front portion FS, the first corner portion CS1, the first side portion SS1 and the second side portion SS2. At least a portion of the second display area DA2 disposed outside the corner where the lower side and the right side of the first display area DA1 meet may be disposed on the front portion FS, the second corner portion CS2, the second side portion SS2 and the third side portion SS3. At least a portion of the second display area DA2 disposed outside the corner where the upper side and the right side of the first display area DA1 meet may be disposed on the front portion FS, the third corner portion CS3, the third side portion SS3 and the fourth side portion SS4. At least a portion of the second display area DA2 disposed outside the corner where the upper side and the left side of the first display area DA1 meet may be disposed on the front portion FS, the fourth corner portion CS4, the first side portion SS1 and the fourth side portion SS4.

In an embodiment, the non-display area NDA may include a first side portion SS1, a second side portion SS2, a third side portion SS3, a fourth side portion SS4, a first corner portion CS1, a second corner portion CS2, a third corner portion CS3 and a fourth corner portion CS4. The non-display area NDA may be disposed outside the first display area DA1 at the first to fourth side portions SS1, SS2, SS3 and SS4. For example, the non-display area NDA may be disposed at a left edge of the first side portion SS1, a lower edge of the second side portion SS2, a right edge of the third side portion SS3 and an upper edge of the fourth side portion SS4.

The non-display area NDA may be disposed outside the third display area DA3 at the first to fourth corner portions CS1, CS2, CS3 and CS4. For example, the non-display area NDA may be disposed at the edge of the corner where an upper side and a left side of the first corner portion CS1 meet, the edge of the corner where an upper side and a right side of the second corner portion CS2 meet, the edge of the corner where an upper side and a left side of the third corner portion CS3 meet and the edge of the corner of the corner where an upper side and a right side of the fourth corner portion CS4 meet.

The bending area BA may be extended from the lower side of the second side portion SS2. The bending area BA may be disposed between the second side portion SS2 and the pad area PA. In an embodiment, a length of the bending area BA in the first direction (X-axis direction) may be shorter than that of the second side portion SS2 in the first direction (X-axis direction). The bending area BA may be bent along a fifth bending line BL5 at the lower side of the second side portion SS2.

The pad area PA may be extended from a lower side of the bending area BA. In an embodiment, a length of the pad area PA in the first direction (X-axis direction) may be greater than that of the bending area BA in the first direction (X-axis direction), but is not necessarily limited thereto. For example, in an embodiment, the length of the pad area PA in the first direction (X-axis direction) may be substantially the same as that of the bending area BA in the first direction (X-axis direction). The pad area PA may be bent along a sixth bending line BL6 at the lower side of the bending area BA. The pad area PA may be disposed on a lower surface of the front portion FS.

An integrated driving circuit IDC and pads PAD may be disposed on the pad area PA. The integrated driving circuit IDC may be formed of an integrated circuit IC. In an embodiment, the integrated driving circuit IDC may be attached onto the pad area PA by a chip on glass (COG) method, a chip on plastic (COP) method or an ultrasonic bonding method. Alternatively, the integrated driving circuit IDC may be disposed on a circuit board disposed on the pads PAD of the pad area PA.

The integrated driving circuit IDC may be electrically connected to the pads PAD of the pad area PA. The integrated driving circuit IDC may receive digital video data and timing signals through the pads PAD of the pad area PA. The integrated driving circuit IDC may convert digital video data into analog data voltages and output the converted analog data voltages to data lines of the first to third display areas DA1, DA2 and DA3.

In an embodiment, the circuit board may be attached onto the pads PAD of the pad area PA by using an anisotropic conductive film. As a result, the pads PAD of the pad area PA may be electrically connected to the circuit board.

As shown in FIG. 3, the first to third display areas DA1, DA2 and DA3 may be disposed on the front portion FS, the first side portion SS1, the second side portion SS2, the third side portion SS3, the fourth side portion SS4, the first corner portion CS1, the second corner portion CS2, the third corner portion CS3 and the fourth corner portion CS4 of the display panel 300. Therefore, an image may be displayed on the first corner portion CS1, the second corner portion CS2, the third corner portion CS3 and the fourth corner portion CS4 as well as the front portion FS, the first side portion SS1, the second side portion SS2, the third side portion SS3 and the fourth side portion SS4 of the display panel 300.

Figure 4:
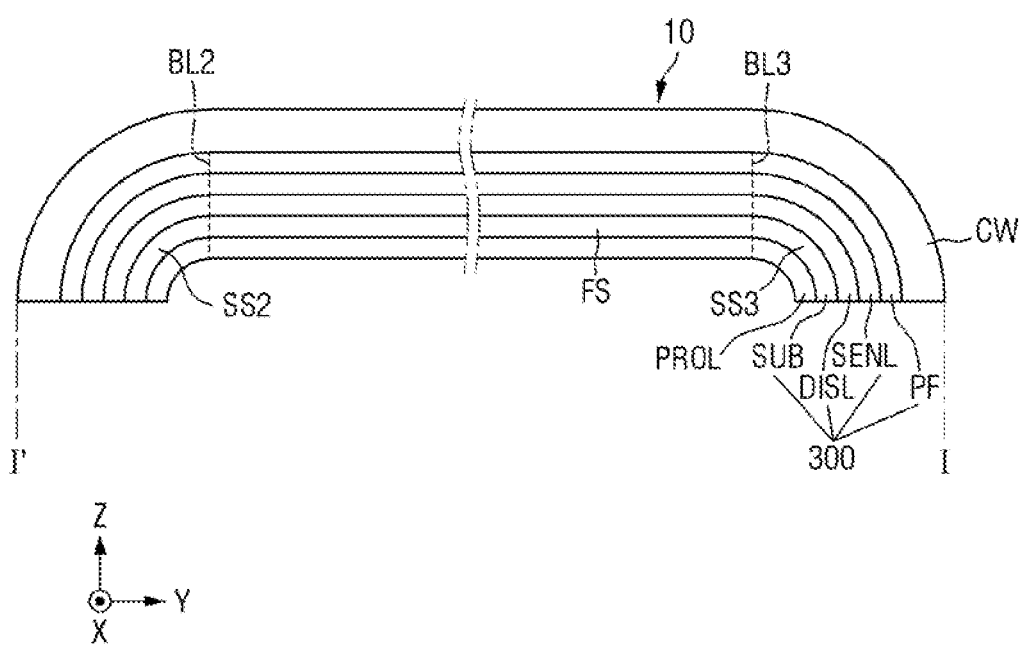
FIG. 4 is a cross-sectional view illustrating an example of a display panel taken along line I-I' of FIG. 2 according to an embodiment of the present disclosure.

FIG. 4 is a cross-sectional view illustrating an example of a display panel taken along line I-I' of FIG. 2.

Referring to FIG. 4, in an embodiment the display device may include a protective member PROL, a substrate SUB, a display layer DISL, a sensor layer SENL, an optical function layer PF, and/or a cover window CW.

Figure 8:
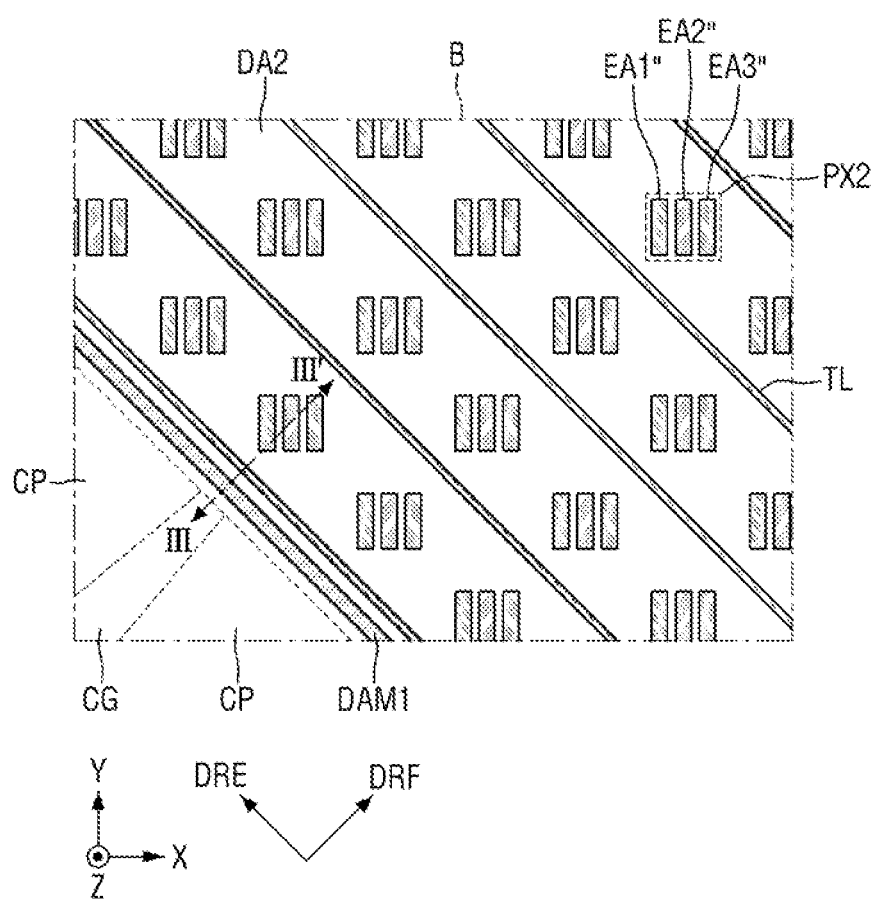
FIG. 8 is an enlarged view illustrating an area B of FIG. 5 according to an embodiment of the present disclosure.
Figure 10:
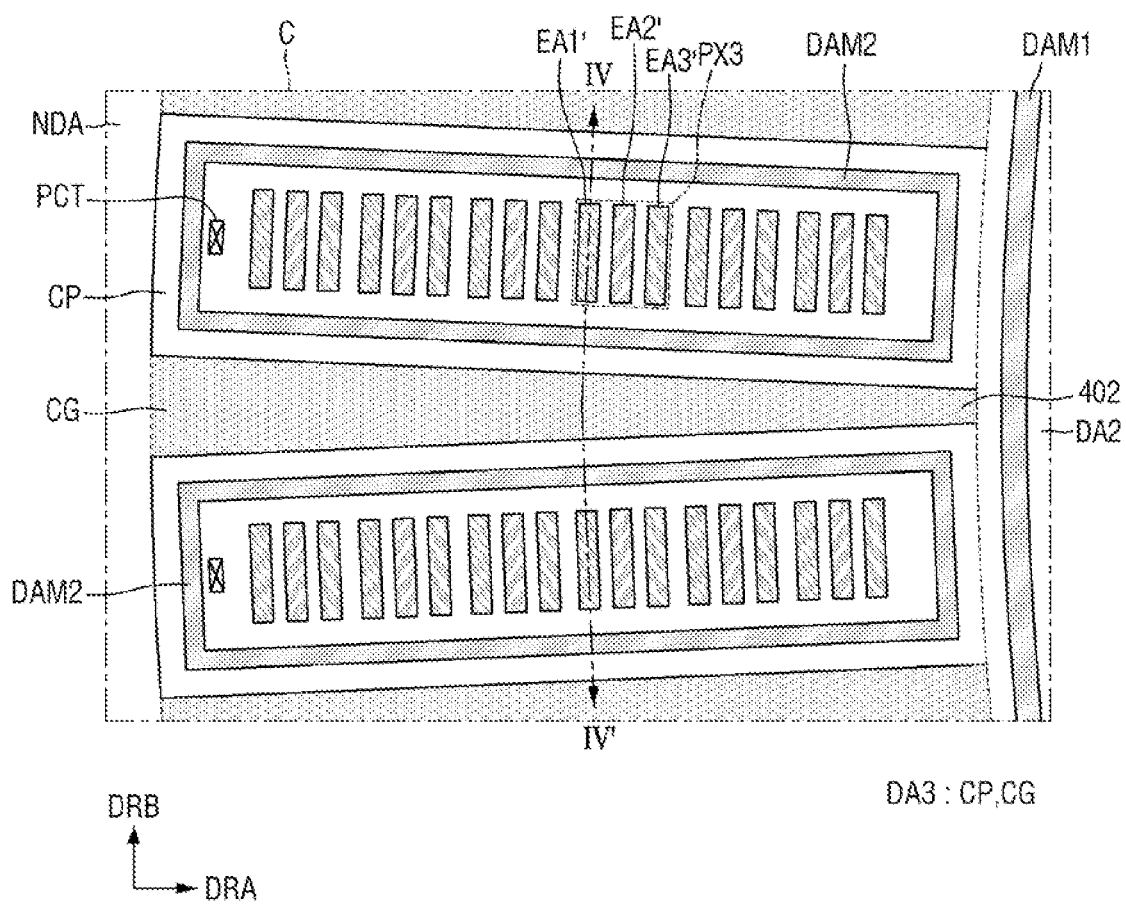
FIG. 10 is an enlarged view illustrating an area C of FIG. 5 according to an embodiment of the present disclosure.

The protective member PROL may protect a lower surface of the display panel 300 from the outside, and may help maintain a shape of the display panel 300 having a cut-out portion CG (FIGS. 8, 10).

The protective member PROL may be made of a material having elasticity. For example, in an embodiment the material of the protective member PROL may be polydimethylsiloxane, but is not necessarily limited thereto. A corner portion of a display has a double curvature having both a curvature of left and right sides and a curvature of upper and lower sides, so that strain may be applied thereto. As the protective member PROL of a material having elasticity may be used, the strain concentrated on the corner portion may be reduced.

The substrate SUB may be disposed on the protective member PROL. Adhesive layers (401 and 402 of FIG. 11) may be disposed between the protective member PROL and the substrate SUB. The adhesive layers will be described later.

In an embodiment, the substrate SUB may be formed of an insulating material such as a polymer resin, glass or the like. For example, the substrate SUB may include polyimide. In this embodiment, the substrate SUB may be a flexible substrate SUB capable of being subjected to bending, folding, rolling or the like.

The display layer DISL may be disposed on the substrate SUB. The display layer DISL may include display areas (DA1, DA2 and DA3 of FIG. 3) and a non-display area NDA. The display area DA of the display layer DISL may include scan lines, data lines, power lines, etc. for driving light emitting elements as well as light emission areas. In the non-display area NDA of the display layer DISL, a scan driving circuit for outputting scan signals to the scan lines and fan-out lines for connecting the data lines with the integrated driving circuit IDC may be disposed.

As shown in FIG. 8, the display layer DISL may include a pixel circuit layer (PCL of FIG. 8) in which thin film transistors are formed, a light emitting element layer (EML of FIG. 8) in which light emitting elements emitting light are disposed in the light emission areas and an encapsulation layer (TFEL of FIG. 7) for encapsulating the light emitting element layer.

The sensor layer SENL may be disposed on the display layer DISL. The sensor layer SENL may include sensor electrodes. The sensor layer SENL may sense a touch of a person or an object by using the sensor electrodes.

The optical function layer PF may be disposed on the sensor layer SENL. In an embodiment, the optical function layer PF may include a first base member, a linear polarizing plate, a phase delay film such as a quarter-wave ($\lambda/4$) plate and/or a half-wave ($\lambda/2$) plate, and a second base member. For example, the first base member, the linear polarizing plate, the $\lambda/4$ plate, the $\lambda/2$ plate and the second base member may be sequentially stacked on the sensor layer SENL.

The cover window CW may be disposed on the optical functional layer PF. In an embodiment, the cover window CW may be attached onto the optical function layer PF by a transparent adhesive member such as an optical transparent adhesive (OCA) or an optical transparent resin (OCR). In an embodiment, the cover window CW may be an inorganic material such as glass, or may be an organic material such as a plastic or polymeric material. However, embodiments of the present disclosure are not necessarily limited thereto.

Figure 5:
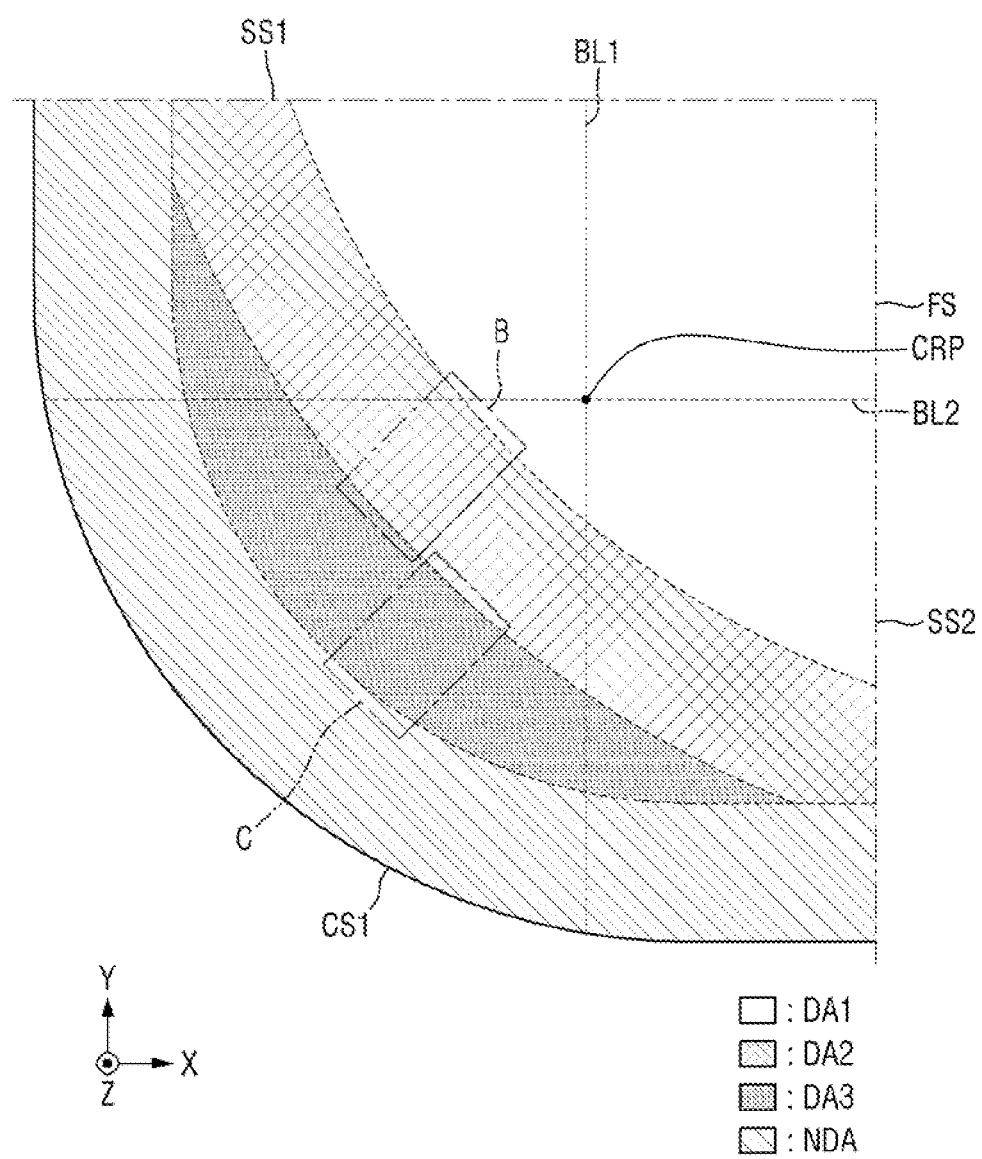
FIG. 5 is a detailed layout view illustrating first to third display areas and a non-display area, which are disposed in a first corner portion of a display panel according to an embodiment of the present disclosure.

FIG. 5 is a detailed layout view illustrating first to third display areas and a non-display area, which are disposed on the first corner portion of the display panel according to an embodiment of the present disclosure.

Referring to FIG. 5, a crossing point CRP of a first bending line BL1 and a second bending line BL2 may be disposed in the first display area DA1. In this embodiment, the first display area DA1 may be disposed on the front portion FS, the first side portion SS1, the second side portion SS2 and the first corner portion CS1. The second display area DA2 may be disposed on the first side portion SS1, the second side portion SS2 and the first corner portion CS1. The third display area DA3 may be disposed on the first side portion SS1, the second side portion SS2 and the first corner portion CS1. The non-display area NDA may be disposed on the first side portion SS1, the second side portion SS2 and the first corner portion CS1.

A position of the crossing point CRP of the first bending line BL1 and the second bending line BL2 is not necessarily limited to the example shown in FIG. 5, and may be disposed in the third display area DA3 or the second display area DA2 in some embodiments.

The first display area DA1 may include first pixels (PX1 of FIG. 7) for displaying an image. The first display area DA1 may include sensor electrodes for sensing a touch of a user. The sensor electrodes may include driving electrodes (TE of FIG. 7) and sensing electrodes (RE of FIG. 7).

Figure 9:
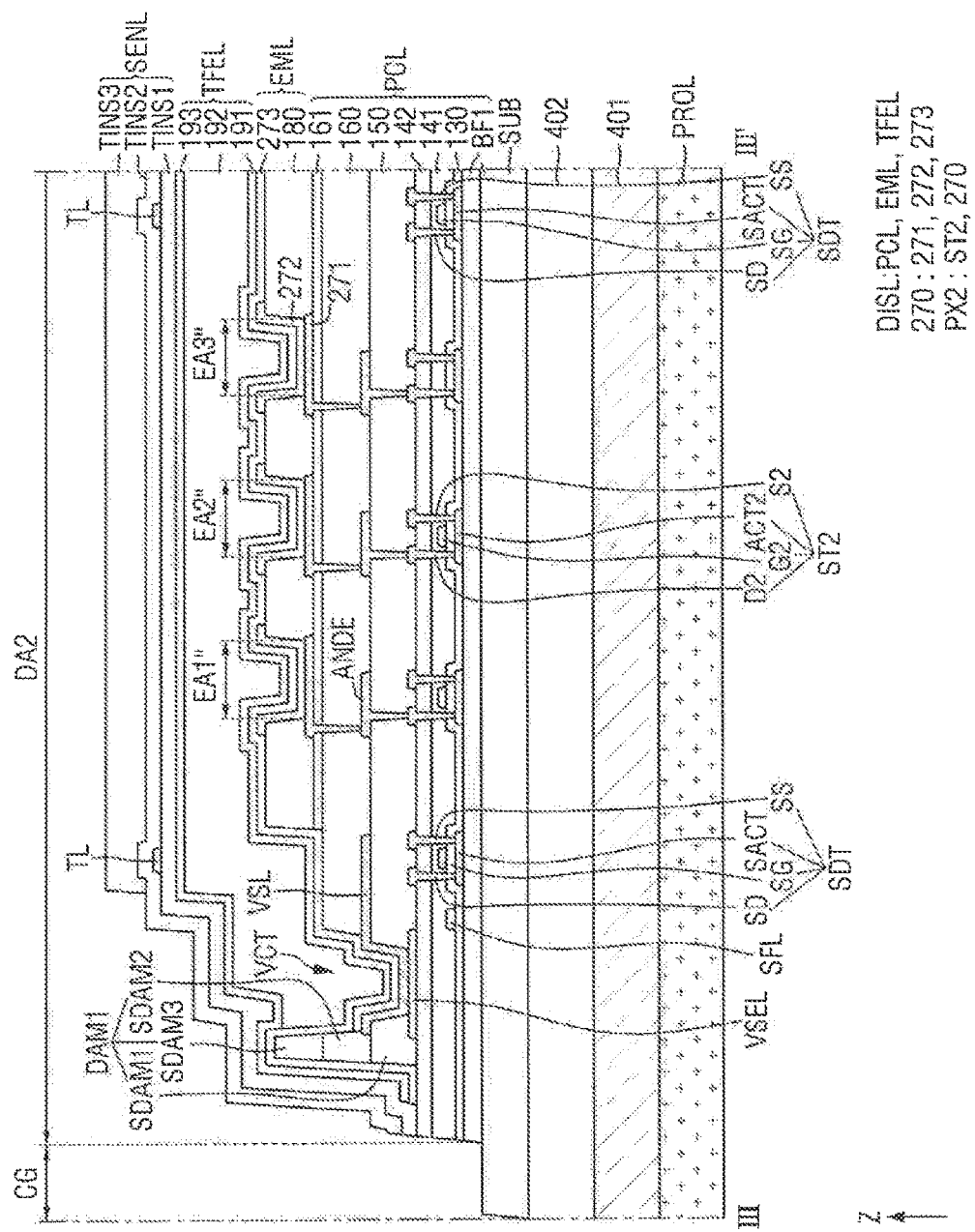
FIG. 9 is a cross-sectional view illustrating an example of a display device taken along line III-III' of FIG. 8 according to an embodiment of the present disclosure.
Figure 11:
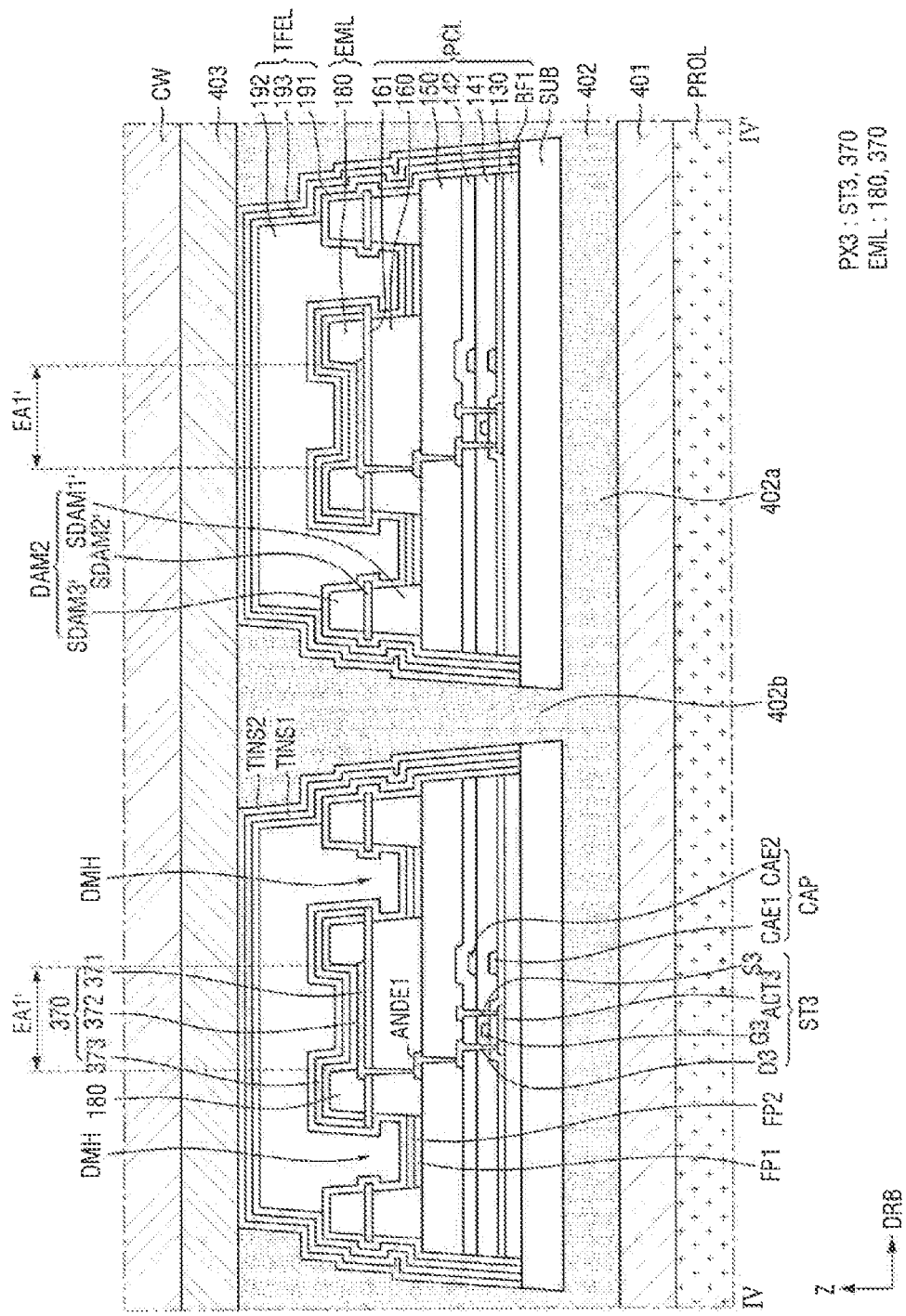
FIG. 11 is a cross-sectional view illustrating a display device taken along line IV-IV' of FIG. 10 according to an embodiment of the present disclosure.

The third display area DA3 may be disposed outside the second display area DA2. The non-display area NDA may be disposed outside the third display area DA3. The third display area DA3 may include second pixels (PX2 of FIG. 10) for displaying an image. In an embodiment, the first corner portion CS1 may include protruding patterns CP and cut-out portions CG to reduce strain caused by the double curvature of the first corner portion CS1, as shown in FIGS. 8 and 9. Alternatively, in an embodiment the first corner portion CS1 may include protruding patterns CP and CP' and cut-out portions CG to reduce strain caused by the double curvature of the first corner portion CS1, as shown in FIGS. 10 and 11.

The second display area DA2 may be disposed outside the first display area DA1. The second display area DA2 may include third pixels (PX3 of FIG. 14) for displaying an image.

In a comparative embodiment in which the non-display area NDA is disposed instead of the second display area DA2, a user may recognize the non-display area NDA between the first display area DA1 and the third display area DA3. For example, a user may recognize a gap between an image displayed by the first display area DA1 and an image displayed by the third display area DA3. In an embodiment in which the second display area DA2 including third pixels (PX3 of FIG. 14) is disposed between the first display area DA1 and the third display area DA3, the gap between the image displayed by the first display area DA1 and the image displayed by the third display area DA3 may be prevented from being visible to the user.

The first to third display areas DA1, DA2 and DA3 and the non-display area NDA, which are disposed in the second corner portion CS2, the third corner portion CS3 and the fourth corner portion CS4 shown in FIG. 3, may be similar to those described with reference to FIG. 5. Therefore, a description of the second corner portion CS2, the third corner portion CS3 and the fourth corner portion CS4 will be omitted for convenience of explanation.

Figure 6:
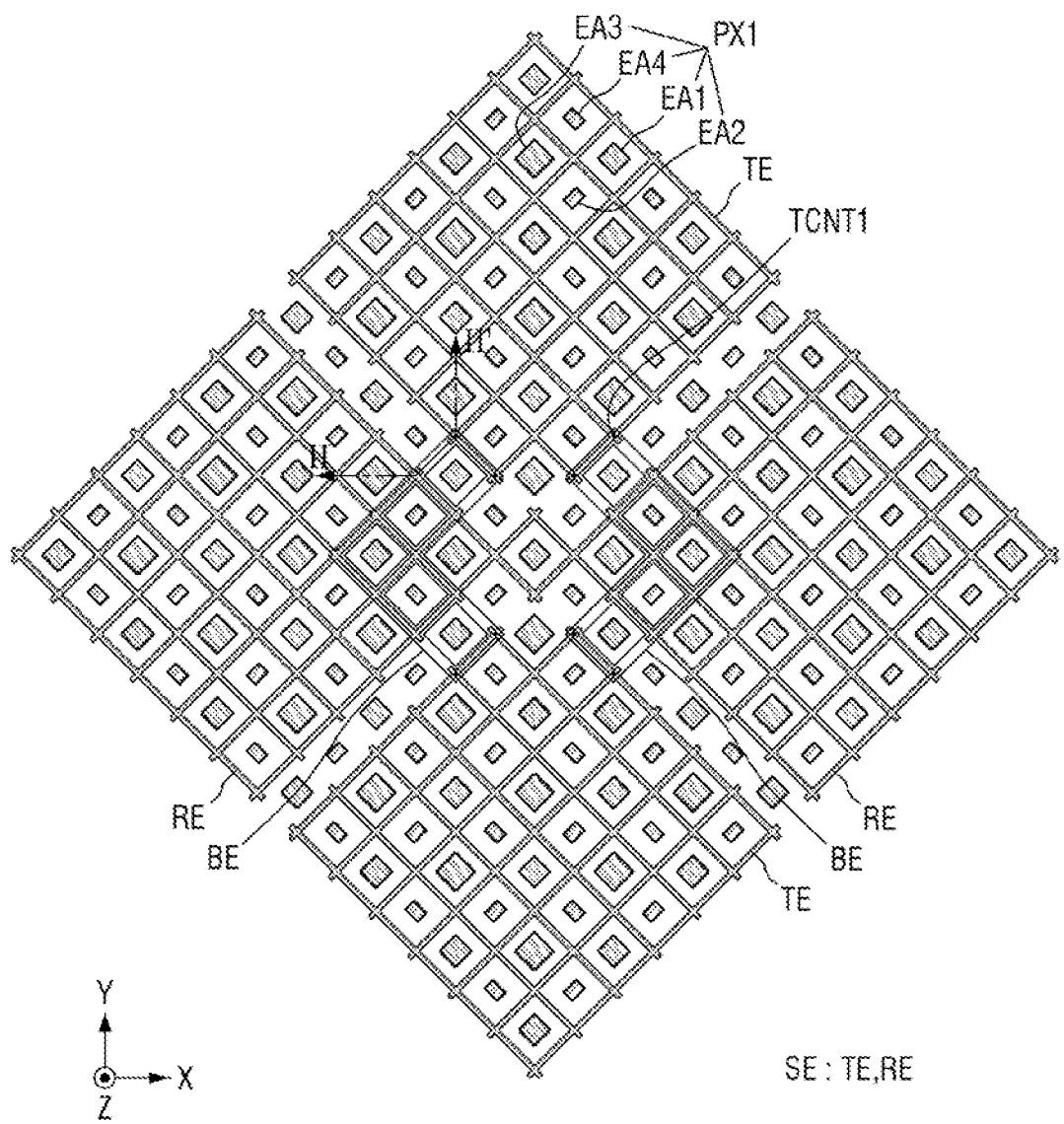
FIG. 6 is a layout view illustrating an example of a first display area of FIG. 5 according to an embodiment of the present disclosure.

FIG. 6 is a layout view illustrating an example of the first display area of FIG. 5.

The first pixels PX1 of the first display area DA1 and the driving electrodes TE and the sensing electrodes RE of the sensor layer (SENL of FIG. 4) are illustrated in FIG. 6. Mutual capacitive touch electrodes that include two types of sensor electrodes, such as driving electrodes TE and sensing electrodes RE to sense a touch of a user are illustrated in FIG. 6. For convenience of description, two sensing electrodes RE adjacent to each other in the first direction (X-axis direction) and two driving electrodes TE adjacent to each other in the second direction (Y-axis direction) are only shown in FIG. 6.

Referring to FIG. 6, the driving electrodes TE and the sensing electrodes RE may be electrically separated from each other. Since the driving electrodes TE and the sensing electrodes RE are formed in the same layer, they may be spaced apart from each other. A gap may be formed between the driving electrode TE and the sensing electrode RE.

The sensing electrodes RE may be electrically connected to each other in the first direction (X-axis direction). The driving electrodes TE may be electrically connected to each other in the second direction (Y-axis direction). In an embodiment, the driving electrodes TE adjacent to each other in the second direction (Y-axis direction) may be connected to each other through touch connection electrodes BE to electrically separate the sensing electrodes RE and the driving electrodes TE from each other at their crossing points.

In an embodiment, the touch connection electrode BE may be formed on a different layer from the driving electrodes TE and the sensing electrodes RE, and may be connected to the driving electrodes TE through first touch contact holes TCNT1. One end of the touch connection electrode BE may be connected to any one of the driving electrodes TE adjacent to each other in the second direction (Y-axis direction) through the first touch contact holes TCNT1. The other end of the touch connection electrode BE may be connected to the other driving electrode TE of the driving electrodes TE adjacent to each other in the second direction (Y-axis direction) through the first touch contact holes TCNT1. The touch connection electrode BE may overlap the sensing electrode RE in the third direction (Z-axis direction). Since the touch connection electrode BE is formed in a different layer from the driving electrodes TE and the sensing electrodes RE, the touch connection electrode BE may be electrically separated from the sensing electrode RE even though it overlaps the sensing electrode RE in the third direction (Z-axis direction).

In an embodiment, the touch connection electrodes BE may be formed to be bent at least once. In FIG. 6, although the touch connection electrodes BE are bent in a clamp shape such as "<" or ">", the shape of the touch connection electrodes BE is not necessarily limited thereto. In addition, since the driving electrodes TE adjacent to each other in the second direction (Y-axis direction) are connected to each other by the plurality of touch connection electrodes BE, the driving electrodes TE adjacent to each other in the second direction (Y-axis direction) may be electrically connected to each other even though any one of the touch connection electrodes BE is disconnected.

In an embodiment, each of the driving electrodes TE and the sensing electrodes RE may have a planar shape of a mesh structure or a netted structure. Since the driving electrodes TE and the sensing electrodes RE are formed on a thin film encapsulation layer (TFEL of FIG. 7), a distance between a first common electrode (173 of FIG. 7) and the driving electrode TE or the sensing electrode RE is relatively close. Therefore, a parasitic capacitance may be formed between the first common electrode (173 of FIG. 7) and the driving electrode TE or the sensing electrode RE. Since the parasitic capacitance is proportional to an overlap area between the first common electrode (173 of FIG. 7) and the driving electrode TE or the sensing electrode RE, it is preferable that the driving electrodes TE and the sensing electrodes RE have a planar shape of a mesh structure or a netted structure to reduce the parasitic capacitance.

The first display area DA1 may include first pixels PX1 for displaying an image. Each of the first pixels PX1 may include a plurality of light emission areas. For example, in an embodiment each of the first pixels PX1 may include a first light emission area EA1, a second light emission area EA2, a third light emission area EA3 and a fourth light emission area EA4. In this embodiment, the first light emission area EA1 may refer to a light emission area of a first subpixel that emits first light, and the second light emission area EA2 may refer to a light emission area of a second subpixel that emits second light. The third light emission area EA3 may refer to a light emission area of a third subpixel that emits third light, and the fourth light emission area EA4 may refer to a light emission area of a fourth subpixel that emits fourth light.

In an embodiment, the first light emission area EA1, the second light emission area EA2, the third light emission area EA3 and the fourth light emission area EA4 may emit light of different colors. However, embodiments of the present disclosure are not necessarily limited thereto. For example, in an embodiment any two of the first light emission area EA', the second light emission area EA2, the third light emission area EA3 and the fourth light emission area EA4 may emit the same color. For example, the first light emission area EA1 may emit red light, the second light emission area EA2 and the fourth light emission area EA4 may emit green light, and the third light emission area EA3 may emit blue light.

The first light emission area EA1, the second light emission area EA2, the third light emission area EA3 and the fourth light emission area EA4 are illustrated as having a rectangular planar shape such as rhombus, but are not necessarily limited thereto. For example, the first light emission area EA1, the second light emission area EA2, the third light emission area EA3 and the fourth light emission area EA4 may have other polygonal, circular or oval planar shape in addition to the rectangular planar shape. Although illustrated that among the first light emission area EA1, the second light emission area EA2, the third light emission area EA3 and the fourth light emission area E4, the third light emission area EA3 is the largest, the first light emission area EA1 is the second largest, and the second light emission area EA2 and the fourth light emission area EA4 are the smallest, embodiments of the present disclosure are not necessarily limited thereto.

Since the driving electrodes TE, the sensing electrodes RE and the touch connection electrodes BE are formed in a planar mesh structure or a planar netted structure, the first to fourth light emission areas EA1, EA2, EA3 and EA4 may not overlap the driving electrodes TE, the sensing electrodes RE and the touch connection electrodes BE in the third direction (Z-axis direction). Therefore, luminance of light emitted from the first to fourth light emission areas EA1, EA2, EA3 and EA4 may be prevented from being reduced by being shielded by the driving electrodes TE, the sensing electrodes RE and the touch connection electrodes BE.

Figure 7:
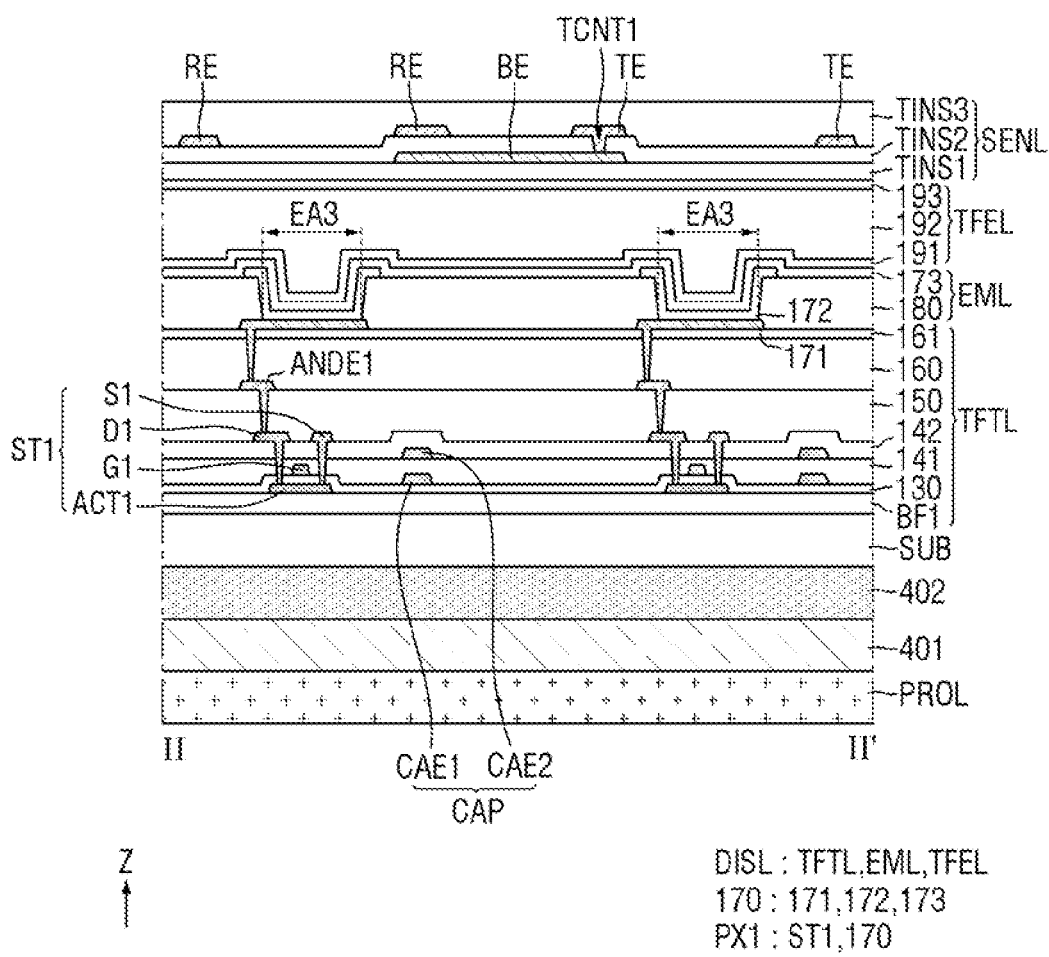
FIG. 7 is a cross-sectional view illustrating an example of a display device taken along line of FIG. 6 according to an embodiment of the present disclosure.

FIG. 7 is a cross-sectional view illustrating an example of a display device taken along line II-II of FIG. 6.

Referring to FIG. 7, a first adhesive layer 401 and a second adhesive layer 402 may be disposed on the protective member PROL, and the substrate SUB may be disposed on the second adhesive layer 402 (e.g., directly thereon in the third direction Z). A display layer DISL including a pixel circuit layer PCL, a light emitting element layer EML and an encapsulation layer TFEL may be disposed on the substrate SUB, and a sensor layer SENL including driving electrodes TE, sensing electrodes RE and touch connection electrodes BE may be disposed on the display layer DISL.

The protective member PROL may protect the lower surface of the display panel 300 from the outside and help maintain the shape of the display panel 300.

The first adhesive layer 401 and the second adhesive layer 402 will be described in detail with reference to FIG. 11.

The pixel circuit layer PCL including first thin film transistors ST1 may be disposed on the substrate SUB. The pixel circuit layer PCL may include a first thin film transistor ST1, a pixel connection electrode ANDE1, a buffer layer BF1, a gate insulating layer 130, a first interlayer insulating layer 141, a second interlayer insulating layer 142, a first planarization layer 150 and a second planarization layer 160.

The buffer layer BF1 may be disposed on the substrate SUB. In an embodiment, the buffer layer BF1 may be formed of a silicon nitride layer, a silicon oxynitride layer, a silicon oxide layer, a titanium oxide layer or an aluminum oxide layer.

The first thin film transistor ST1 may be disposed on the buffer layer BF1. The first thin film transistor ST1 may include a first active layer ACT1, a first gate electrode G1, a first source electrode S1 and a first drain electrode D1.

A first active layer ACT1 of the first thin film transistor ST1 may be disposed on the buffer layer BF1. In an embodiment, the first active layer ACT1 may include a silicon semiconductor such as polycrystalline silicon, monocrystalline silicon, low temperature polycrystalline silicon and amorphous silicon. The first active layer ACT1 that overlaps the first gate electrode G1 in the third direction (Z-axis direction) may be defined as a channel area. The first active layer ACT1 that does not overlap the first gate electrode G1 in the third direction (Z-axis direction) may be defined as a conductive area. The conductive area of the first active layer ACT1 may have conductivity by doping ions or impurities on the silicon semiconductor.

The gate insulating layer 130 may be disposed on the first active layer ACT1 of the first thin film transistor ST1. In an embodiment, the gate insulating layer 130 may be formed of an inorganic layer, for example, a silicon nitride layer, a silicon oxynitride layer, a silicon oxide layer, a titanium oxide layer or an aluminum oxide layer.

The first gate electrode G1 and a first capacitor electrode CAE1 of the first thin film transistor ST1 may be disposed on the gate insulating layer 130. The first gate electrode G1 of the first thin film transistor ST1 may overlap the first active layer ACT1 in the third direction (Z-axis direction). The first capacitor electrode CAE1 may overlap a second capacitor electrode CAE2 in the third direction (Z-axis direction). In an embodiment, the first gate electrode G1 and the first capacitor electrode CAE1 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

The first interlayer insulating layer 141 may be disposed on the first gate electrode G1 and the first capacitor electrode CAE1. In an embodiment, the first interlayer insulating layer 141 may be formed of an inorganic layer, for example, a silicon nitride layer, a silicon oxynitride layer, a silicon oxide layer, a titanium oxide layer or an aluminum oxide layer. The first interlayer insulating layer 141 may include a plurality of inorganic layers.

The second capacitor electrode CAE2 may be disposed on the first interlayer insulating layer 141. The second capacitor electrode CAE2 may overlap the first capacitor electrode CAE1 in the third direction (Z-axis direction). Since the first interlayer insulating layer 141 has a predetermined dielectric constant, a capacitor may be formed by the first capacitor electrode CAE1, the second capacitor electrode CAE2 and the first interlayer insulating layer 141. In an embodiment, the second capacitor electrode CAE2 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

The second interlayer insulating layer 142 may be disposed on the second capacitor electrode CAE2. In an embodiment, the second interlayer insulating layer 142 may be formed of an inorganic layer, for example, a silicon nitride layer, a silicon oxynitride layer, a silicon oxide layer, a titanium oxide layer or an aluminum oxide layer.

The first source electrode S1 and the first drain electrode D1 of the first thin film transistor ST1 may be disposed on the second interlayer insulating layer 142. In an embodiment, the first source electrode S1 and the first drain electrode D1 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

In an embodiment, the first source electrode S1 of the first thin film transistor ST1 may be connected to the conductive area disposed on one side of the channel area of the first active layer ACT1 through a contact hole that passes through the gate insulating layer 130, the first interlayer insulating layer 141 and the second interlayer insulating layer 142. The first drain electrode D1 of the first thin film transistor ST1 may be connected to the conductive area disposed on the other side of the channel area of the first active layer ACT1 through a contact hole that passes through the gate insulating layer 130, the first interlayer insulating layer 141 and the second interlayer insulating layer 142.

The first planarization layer 150 may be disposed on the first source electrode S1 and the first drain electrode D1 to planarize a step difference caused by the thin film transistors. In an embodiment, the first planarization layer 150 may be formed of an organic layer such as an acrylic resin, an epoxy resin, a phenolic resin, a polyamide resin and a polyimide resin.

The pixel connection electrode ANDE1 may be disposed on the first planarization layer 150. The pixel connection electrode ANDE1 may be connected to the first source electrode S1 or the first drain electrode D1 of the first thin film transistor ST1 through a contact hole that passes through the first planarization layer 150. In an embodiment, the pixel connection electrode ANDE1 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

The second planarization layer 160 may be disposed on the pixel connection electrode ANDE1. In an embodiment, the second planarization layer 160 may be formed of an organic layer such as an acrylic resin, an epoxy resin, a phenolic resin, a polyamide resin and a polyimide resin.

A barrier layer 161 may be disposed on the second planarization layer 160. In an embodiment, the barrier layer 161 may be formed of a silicon nitride layer, a silicon oxynitride layer, a silicon oxide layer, a titanium oxide layer or an aluminum oxide layer.

The light emitting element layer EML is disposed on the pixel circuit layer PCL. The light emitting element layer EML may include first light emitting elements 170 and a bank 180.

Each of the first light emitting elements 170 may include a first pixel electrode 171, a first light emitting layer 172 and a first common electrode 173. Each of the first to fourth light emission areas EA1, EA2, EA3 and EA4 refers to an area where the first pixel electrode 171, the first light emitting layer 172 and the first common electrode 173 are sequentially stacked so that holes from the first pixel electrode 171 and electrons from the first common electrode 173 are combined with each other in the first light emitting layer 172 to emit light. In an embodiment, the first pixel electrode 171 may be an anode electrode, and the first common electrode 173 may be a cathode electrode. The first light emission area EA1, the second light emission area. EA2 and the fourth light emission area EA4 may be substantially the same as the third light emission area EA3 shown in FIG. 7.

The first pixel electrode 171 may be disposed on the barrier layer 161. The first pixel electrode 171 may be connected to the pixel connection electrode ANDE1 through a contact hole that passes through the barrier layer 161 and the second planarization layer 160.

In an embodiment in which a top emission structure has light that is emitted toward the first common electrode 173 based on the first light emitting layer 172, the first pixel electrode 171 may be formed of a single layer of molybdenum (Mo), titanium (Ti), copper (Cu) or aluminum (Al), or may be formed of a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO. The APC alloy is an alloy of silver (Ag), palladium (Pd) and copper (Cu).

The bank 180 serves to define the first to fourth light emission areas EA1, EA2, EA3 and EA4 of display pixels. To this end, the bank 180 may be formed to expose a portion of the first pixel electrode 171 on the barrier layer 161. For example, in an embodiment, the bank 180 may cover an edge of the first pixel electrode 171 and expose a central portion of the first pixel electrode 171. The bank 180 may be disposed in the contact hole that passes through the barrier layer 161 and the second planarization layer 160. Therefore, the contact hole passing through the barrier layer 161 and the second planarization layer 160 may be filled by the bank 180. In an embodiment, the bank 180 may be formed of an organic layer such as an acrylic resin, an epoxy resin, a phenolic resin, a polyamide resin and a polyimide resin.

The first light emitting layer 172 is disposed on the first pixel electrode 171. The first light emitting layer 172 may include an organic material to emit a predetermined color. For example, the first light emitting layer 172 may include a hole transporting layer, an organic material layer and an electron transporting layer. The organic material layer may include a host and a dopant. The organic material layer may include a material that emits light, and may be formed using a phosphorescent material or a fluorescent material.

The first common electrode 173 is disposed on the first light emitting layer 172. The first common electrode 173 may cover the first light emitting layer 172. In an embodiment, the first common electrode 173 may be a common layer commonly formed on the display pixels. A capping layer may be formed on the first common electrode 173.

In the top emission structure, the first common electrode 173 may be formed of a transparent conductive material such as ITO and IZO, or a semi-transmissive metal material such as magnesium (Mg), silver (Ag) or an alloy of magnesium (Mg) and silver (Ag). In an embodiment in which the first common electrode 173 is formed of a semi-transmissive metal material, light output efficiency may be increased by a micro cavity.

The encapsulation layer TFEL may be formed on the light emitting element layer EML. The encapsulation layer TFEL may include at least one inorganic layer to prevent oxygen or moisture from being permeated into the light emitting element layer EML. The encapsulation layer TFEL may also include at least one organic layer to protect the light emitting element layer EML from the particles.

For example, in an embodiment the thin film encapsulation layer TFEL may include a first encapsulation inorganic layer 191 disposed on the first common electrode 173, an encapsulation organic layer 192 disposed on the first encapsulation inorganic layer 191, and a second encapsulation inorganic layer 193 disposed on the encapsulation organic layer 192. In an embodiment, the first encapsulation inorganic layer 191 and the second encapsulation inorganic layer 193 may be formed of multiple layers, such as one or more inorganic layers of a silicon nitride layer, a silicon oxynitride layer, a silicon oxide layer, a titanium oxide layer and an aluminum oxide layer that are alternately stacked. In an embodiment, the organic layer may be an acrylic resin, an epoxy resin, a phenolic resin, a polyamide resin or a polyimide resin.

The sensor layer SENL is disposed on the encapsulation layer TFEL. The sensor layer SENL may include driving electrodes TE, sensing electrodes RE and touch connection electrodes BE.

A first touch inorganic layer TINS1 may be disposed on the encapsulation layer TFEL. In an embodiment, the first touch inorganic layer TINS1 may be formed of a silicon nitride layer, a silicon oxynitride layer, a silicon oxide layer, a titanium oxide layer or an aluminum oxide layer.

The touch connection electrodes BE may be disposed on the first touch inorganic layer TINS1. In an embodiment, the touch connection electrodes BE may be formed of a single layer of molybdenum (Mo), titanium (Ti), copper (Cu), or aluminum (Al), or may be formed of a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO.

A second touch inorganic layer TINS2 may be disposed on the touch connection electrodes BE. In an embodiment, the second touch inorganic layer TINS2 may be formed of a silicon nitride layer, a silicon oxynitride layer, a silicon oxide layer, a titanium oxide layer or an aluminum oxide layer.

The driving electrodes TE and the sensing electrodes RE may be disposed on the second touch inorganic layer TINS2. In an embodiment, the driving electrodes TE and the sensing electrodes RE may not overlap the first to fourth light emission areas EA1, EA2, EA3 and EA4 to prevent luminance of light emitted from the light emission areas EA1, EA2, EA3 and EA4 from being reduced by being shielded by the driving electrodes TE and the sensing electrodes RE. In an embodiment, the driving electrodes TE and the sensing electrodes RE may be formed of a single layer of molybdenum (Mo), titanium (Ti), copper (Cu) or aluminum (Al), or may be formed of a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO.

A touch organic layer TINS3 may be disposed on the driving electrodes TE and the sensing electrodes RE. In an embodiment, the touch organic layer TINS3 may be an acrylic resin, an epoxy resin, a phenolic resin, a polyamide resin or a polyimide resin.

FIG. 8 is an enlarged view illustrating an area B of FIG. 5.

Referring to FIG. 8, touch driving lines TL may be extended in an E-direction DRE. In an embodiment, the E-direction DRE may be a direction inclined at 135° with respect to the first direction (X-axis direction) and inclined at 45° with respect to the second direction (Y-axis direction). The touch driving lines TL may be arranged (e.g., spaced apart) in an F-direction DRF crossing the E-direction DRE. The F-direction DRF may be a direction inclined at 45° with respect to the first direction (X-axis direction) and inclined at 45° with respect to the second direction (Y-axis direction).

Second pixels PX2 may be disposed between the touch driving lines TL adjacent to each other. The second pixels PX2 disposed between the adjacent touch driving lines TL may be arranged in (e.g., spaced apart in) the E-direction DRE. At least one touch driving line TL may be disposed between second light emission areas EA2" adjacent to each other in the F-direction DRF. In an embodiment, a spaced distance between the touch driving lines TL in the F-direction DRF and a spaced distance between the second pixels PX2 in the F-direction DRF may be tens of μm, approximately.

Each of the second pixels PX2 may include a plurality of light emission areas, such as first to third light emission areas EA1", EA2" and EA3". In an embodiment, the number of light emission areas of each of the second pixels PX2 may be different from the number of light emission areas EA1, EA2, EA3 and EA4 of the first pixels PX1.

For example, in an embodiment each of the second pixels PX2 may include a first light emission area EA1", a second light emission area EA2" and a third light emission area EA3". In this embodiment, the first light emission area EA1" refers to a light emission area of a first subpixel emitting first light, the second light emission area EA2" refers to a light emission area of a second subpixel emitting second light, and the third light emission area EA3" refers to a light emission area of a third subpixel emitting third light.

In an embodiment, the first light emission area EA1", the second light emission area EA2" and the third light emission area EA3" may emit light of different colors. For example, the first light emission area EA1" may emit red light, the second light emission area EA2" may emit green light, and the third light emission area EA3" may emit blue light. However, embodiments of the present disclosure are not necessarily limited thereto.

The first light emission area EA1", the second light emission area EA2" and the third light emission area EA3" may be arranged in the first direction (X-axis direction). Alternatively, the first light emission area EA1", the second light emission area EA2" and the third light emission area EA3" may be arranged in the F-direction DRF.

In an embodiment, a planar shape of each of the first to third light emission areas EA1", EA2" and EA3" of the second pixels PX2 may be different from that of each of the first to fourth light emission areas EA1, EA2, EA3 and EA4 of the first pixels PX1. For example, each of the first light emission area EA1", the second light emission area EA2" and the third light emission area EA3" may have a rectangular planar shape. For example, each of the first light emission area EA1", the second light emission area EA2" and the third light emission area EA3" may have a rectangular planar shape with a short side in the first direction (X-direction) and a long side in the second direction (Y-axis direction).

However, the planar shape of each of the first light emission area EA1", the second light emission area EA2" and the third light emission area EA3" is not necessarily limited to the rectangular plane shape, and each of the first light emission area EA1", the second light emission area EA2" and the third light emission area EA3" may have other polygonal, circular or oval planar shape in addition to the rectangular planar shape. Also, although FIG. 8 illustrates that the first light emission area EA1", the second light emission area EA2" and the third light emission area EA3" have substantially the same area, embodiments of the present disclosure are not necessarily limited thereto. For example, at least one of the first light emission area EA1", the second light emission area EA2" or the third light emission area EA3" may have a size different from that of the other areas.

A first dam DAM1 may be disposed at an edge of the second display area DA2 adjacent to the third display area DA3. The first dam DAM1 may be disposed between the touch driving line TL and the protruding pattern CP of the third display area DA3. The first dam DAM1 may be a structure for preventing the encapsulation organic layer (192 of FIG. 9) of the encapsulation layer TFEL from overflowing. In an embodiment, the first dam DAM1 may be extended in the E-direction DRE.

As shown in FIG. 8, the second display area DA2 including second pixels PX2 for displaying an image is disposed between the first display area DA1 and the third display area DA3. Therefore, a gap between an image displayed by the first display area DA1 and an image displayed by the third display area DA3 may be prevented from being visible to a user.

FIG. 9 is a cross-sectional view illustrating an example of a display device taken along line III-III' of FIG. 8.

Referring to FIG. 9, a first adhesive layer 401 may be disposed on a protective member PROL, a second adhesive layer 402 may be disposed on the first adhesive layer 401, and a substrate SUB may be disposed on the second adhesive layer 402.

Since a second thin film transistor ST2 of a pixel circuit layer PCL, a second pixel electrode 271 of a second light emitting element 270, a second light emitting layer 272 and a second common electrode 273 may be substantially the same as the first thin film transistor ST1 of the pixel circuit layer PCL, the first pixel electrode 171 of the first light emitting element 170, the first light emitting layer 172 and the first common electrode 173, which are described with reference to FIG. 7, a repeated description will be omitted for convenience of explanation.

The second display area DA2 may include second pixels PX2 and touch driving lines TL. The touch driving lines TL may be connected to the driving electrodes (TE of FIG. 6). The second display area DA2 may include touch sensing lines connected to the sensing electrodes (RE of FIG. 6), as well as the touch driving lines TL.

In an embodiment, the touch driving lines TL do not overlap the first light emission area EA1", the second light emission area EA2" and the third light emission area EA3" to prevent luminance of light emitted from the light emission areas EA1", EA2" and EA3" of the second display area DA2 from being reduced by being shielded by the touch driving lines TL. The touch driving lines TL may be disposed on the first touch inorganic layer TINS1. In an embodiment, the touch driving lines TL may be formed of the same material as that of the connection electrode (BE1 of FIG. 6) on the same layer.

A scan driving transistor SDT of a scan driving circuit SDC may include a scan active layer SACT, a scan gate electrode SG, a scan source electrode SS and a scan drain electrode SD. Since the scan active layer SACT, the scan gate electrode SG, the scan source electrode SS and the scan drain electrode SD of the scan driving transistor SDT may be substantially the same as the first active layer ACT1, the first gate electrode G1, the first source electrode S1 and the first drain electrode D1 of the first thin film transistor ST1, which are described with reference to FIG. 7, detailed descriptions thereof will be omitted for convenience of explanation.

The scan driving transistor SDT is disposed on the pixel circuit layer PCL along with the second thin film transistors ST2 for driving the first light emission area EA1", the second light emission area EA2" and the third light emission area EA3" of the second pixels PX2. Therefore, the scan driving transistor SDT may be disposed in an area in which the second thin film transistors ST2 are not disposed, to avoid the second thin film transistors ST2. In an embodiment, since the touch driving lines TL are disposed so as not to overlap the first light emission area EA1", the second light emission area EA2" and the third light emission area EA3", the scan driving transistor SDT may overlap the touch driving line TL in the third direction (Z-axis direction).

A first power connection line VSEL may be disposed on the second interlayer insulating layer 142. In an embodiment, the first power connection line VSEL may be formed of the same material as that of the first source electrode S1 and the first drain electrode D1 of the first thin film transistor ST1, the second source electrode S2 and the second drain electrode D2 of the second thin film transistor ST2, and the source electrode SS and the drain electrode SD of the scan driving transistor SDT.

A first power line VSL may be disposed on the first planarization layer 150. The first power line VSL may be formed of the same material as that of the pixel connection electrode ANDE1. The first power line VSL may be connected to the first power connection line VSEL through a contact hole that passes through the first planarization layer 150. A first power voltage may be applied to the first power line VSL.

The second common electrode 273 may be connected to the first power line VSL through a contact hole that passes through the second planarization layer 160. The first power voltage of the first power line VSL may be applied to the second common electrode 273.

A first dam DAM1 for preventing the encapsulation organic layer 192 of the thin film encapsulation layer from overflowing may be disposed in the second display area DA2. In an embodiment, the first dam DAM1 may include a first sub dam SDAM1 formed of the same material as that of the first planarization layer 150, a second sub dam SDAM2 formed of the same material as that of the second planarization layer 160, and a third sub dam SDAM3 formed of the same material as that of the bank 180. An end of the encapsulation organic layer 192 may be disposed between the first light emission area EA1" disposed at the outermost side and the dam DAM due to the first dam DAM1. The first encapsulation inorganic layer 191 and the second encapsulation inorganic layer 193 may be disposed on the first dam DAM1. The first encapsulation inorganic layer 191 and the second encapsulation inorganic layer 193 may be in direct contact with each other on the first dam DAM1.

In an embodiment, another dam for covering the encapsulation organic layer 192 overflowing the first dam DAM1 may be disposed outside the first dam DAM1. In this embodiment, the another dam may have a structure substantially the same as that of the first dam DAM1. Alternatively, the another dam may include at least one of the first sub-dam SDAM1, the second sub-dam SDAM2 or the third sub-dam SDAM3 of the first dam DAM1.

As shown in FIG. 9, the scan driving transistors SDT of the scan driving circuit SDC may be disposed in an area, in which the second thin film transistors ST2 are not disposed, to avoid the second thin film transistors ST2 for driving the first light emission area EA1", the second light emission area EA2" and the third light emission area EA3" of the second pixel PX2. In this embodiment, since the touch driving lines TL are disposed so as not to overlap the first light emission area EA1", the second light emission area EA2" and the third light emission area EA", the scan driving transistor SDT may overlap the touch driving line TL in the third direction (Z-axis direction).

FIG. 10 is an enlarged view illustrating an area C of FIG. 5.

Referring to FIG. 10, the third display area DA3 of the first corner portion CS1 may include a plurality of protruding patterns CP and cut-out portions CG.

The protruding patterns CP may be partitioned by the cut-out portions CG. The cut-out portion CG may be disposed between the protruding patterns CP adjacent to each other. In an embodiment, the protruding patterns CP and the cut-out portions CG may be formed by removing a portion of the display panel 300 through a photo process and an etching process, but embodiments of the present disclosure are not necessarily limited thereto. For example, the protruding patterns CP and the cut-out portions CG may be formed by removing a portion of the display panel 300 by a laser. The cut-out portion CG may be an area from which the display panel 300 is removed, and the protruding pattern CP may be an area from which the display panel is not removed. The protruding patterns CP may be separation patterns separated from each other with the cut-out portions CG interposed therebetween.

In an embodiment, each of the protruding patterns CP may be disposed between the second display area DA2 and the non-display area NDA. In an embodiment, one end of each of the protruding patterns CP may be connected to the second display area DA2 and the other end thereof may be connected to the non-display area NDA.

Third pixels PX3, a second dam DAM2 and a power contact hole PCT may be disposed in each of the protruding patterns CP.

In an embodiment, the third pixels PX3 may be arranged in an A-direction DRA. Each of the third pixels PX3 may include a plurality of light emission areas, such as first to third light emission areas EA1', EA2' and EA3'. In an embodiment, the number of light emission areas of each of the third pixels PX3 may be different from the number of light emission areas of each of the first pixels PX1. In an embodiment, the number of light emission areas of each of the third pixels PX3 may be the same as the number of light emission areas of each of the third pixels PX3, but are not necessarily limited thereto. For example, in an embodiment, the number of light emission areas of each of the third pixels PX3 may be different from the number of light emission areas of each of the third pixels PX3.

For example, in an embodiment each of the third pixels PX3 may include a first light emission area EA1', a second light emission area EA2' and a third light emission area EA3'. In this embodiment, the first light emission area EA1' refers to a light emission area of a first subpixel emitting first light, the second light emission area EA2' refers to a light emission area of a second subpixel emitting second light, and the third light emission area EA3' refers to a light emission area of a third subpixel emitting third light.

In an embodiment, the first light emission area EA1', the second light emission area EA2' and the third light emission area EA3' may emit light of different colors. For example, the first light emission area EA1' may emit red light, the second light emission area EA2' may emit green light, and the third light emission area EA3' may emit blue light.

The first light emission area EA1', the second light emission area EA2' and the third light emission area EA3' may be arranged in the A-direction DRA. In an embodiment, each of the first light emission area EA1', the second light emission area EA2' and the third light emission area EA3' may have a rectangular planar shape. For example, each of the first light emission area EA1', the second light emission area EA2' and the third light emission area EA3' may have a rectangular planar shape with a short side in the A-direction DRA and a long side of the B-direction DRB, but embodiments of the present disclosure are not necessarily limited thereto. For example, each of the first light emission area EA1', the second light emission area EA2' and the third light emission area EA3' may have other polygonal, circular or oval planar shape in addition to the rectangular planar shape in some embodiments. In FIG. 11, the first light emission area EA1', the second light emission area EA2' and the third light emission area EA3' have substantially the same size, but are not necessarily limited thereto. For example, at least one of the first light emission area EA1', the second light emission area EA2' and the third light emission area EA3' may have a different size from the other areas.

The second dam DAM2 may be arranged to surround the third pixels PX3. The second dam DAM2 may be disposed at the edge of each of the protruding patterns CP.

The power contact hole PCT may be disposed in an area surrounded by the second dam DAM2. In FIG. 10, the power contact hole PCT is disposed between the third pixel PX3 and the second dam DAM2 disposed at the edge of one side of the protruding pattern CP, but is not necessarily limited thereto. The power contact hole PCT may be a power connection portion to which the first power line (VSL of FIG. 9) and the second common electrode (273 of FIG. 11) are connected. As a result, the first power voltage of the first power line (VSL of FIG. 9) may be applied to the second common electrode (273 of FIG. 11).

The second adhesive layer 402 may be disposed in the cut-out portion CG. For example, the second adhesive layer 402 may fill the space from which the display panel 300 is removed. Therefore, a shape of the cut-out portion CG and a shape of the second adhesive layer 402 may be the same as each other in the cross-sectional view. The second adhesive layer 402 will be described in detail with reference to FIG. 11.

FIG. 11 is a cross-sectional view taken along line IV-IV' of FIG. 10.

Referring to FIG. 11, the protective member PROL may be disposed on a lower surface of the display panel 300. The protective member PROL may be disposed to overlap the protruding pattern CP and the cut-out portion CG in the third direction (Z-axis direction).

The protective member PROL may protect the lower surface of the display panel 300 from the outside, and may help maintain the shape of the display panel 300 having the cut-out portion CG.

In an embodiment, the protective member PROL may be made of a material having elasticity. For example, the material of the protective member PROL may be polydimethylsiloxane, but is not necessarily limited thereto. A corner portion of a display has a double curvature having both a curvature of left and right sides and a curvature of upper and lower sides, so that strain may be applied thereto. As the protective member PROL of a material having elasticity is used, the strain concentrated on the corner portion may be reduced.

As the protective member PROL having elasticity is used, the protective member PROL may be sufficiently contracted. Therefore, when a guide film applies pressure to the side portion of the display during the manufacturing process of the display, the corner portion may be protruded to prevent the protective member PROL of the corner portion from being previously in contact with the cover window CW. Also, the corner portion may be sufficiently contracted due to elasticity of the protective member PROL. As pressure is concentrated on the corner portion due to non-contraction of the corner portion, the display panel 300 of the corner portion and the display panel 300 of the side portion overlap each other, whereby light emitted from the display panel 300 disposed on the lower surface may not be visible from the outside. However, since the corner portion is sufficiently contracted as above, the light emitted from the display panel 300 may be prevented from being visible from the outside.

The adhesive layer between the lower surface of the protruding pattern CP and the upper surface of the protective member PROL may be formed of a multi-layer.

The first adhesive layer 401 may be disposed on the upper surface of the protective member PROL. The first adhesive layer 401 may be disposed to be in direct contact with the upper surface of the protective member PROL to fully surround the upper surface of the protective member PROL at the same thickness, but is not necessarily limited thereto. For example, a width of the lower surface of the first adhesive layer 401 may be less than that of the protective member PROL, so that a portion of the upper surface of the protective member PROL may not be in direct contact with the first adhesive layer 401.

The first adhesive layer 401 may serve to attach the protective member PROL to another element. Therefore, the first adhesive layer 401 may be formed of a material capable of being adhered to the protective member PROL, and the lower surface of the first adhesive layer 401 may be in direct contact with the upper surface of the protective member PROL, thereby being adhered to the upper surface of the protective member PROL. In an embodiment, the adhesive layer may be a viscosity layer or an adhesive layer.

In an embodiment in which the protective member PROL made of polydimethylsiloxane is used, the first adhesive layer 401 may include, but is not necessarily limited to, a first coupling composition comprising an optically transparent material of a silicon material such as a silicon-based optical transparent adhesive (OCA). For example, when the first adhesive layer 401 and the protective member PROL are in direct contact with each other, a covalent bond may be formed between molecules of the first adhesive layer 401 and molecules of the protective member PROL, or the first adhesive layer 401 may include a transparent material and an opaque material of materials capable of generating a van der Waals force or a London dispersion force between the molecules of the first adhesive layer 401 and the molecules of the protective member. As the protective member PROL is made of polydimethylsiloxane, the first coupling composition of the first adhesive layer 401 may have a greater adhesive force than a second coupling composition of the second adhesive layer 402 with respect to the protective member PROL.

The second adhesive layer 402 may be disposed on an upper surface of the first adhesive layer 401. For example, the second adhesive layer 402 may be at least partially disposed between an upper surface of the first adhesive layer 401 and a lower surface of the display panel 300. A portion having a flat shape between the first adhesive layer 401 and the protruding pattern CP is defined as a base portion 402a, and a portion disposed between the protruding patterns CP adjacent to each other in the cut-out portion CG is defined as a protruding portion 402b. In an embodiment, the base portion 402a and the protruding portion 402b may be integrally formed without a separate interface in a portion where the base portion 402a and the protruding portion 402b are in contact with each other.

In an embodiment, a lower surface of the base portion 402a may fully cover the upper surface of the first adhesive layer 401 in the same shape as that of the upper surface of the first adhesive layer 401. An upper surface of the base portion 402a may be in direct contact with the lower surface of the protruding pattern CP and the protruding portion 402b. Therefore, the base portion 402a may fully cover the lower surface of the protruding pattern CP. In an embodiment, a side of the protruding portion 402b may fully cover the side of the protruding pattern CP, and may fully fill the space formed by the cut-out portion CG of the display panel 300. Therefore, the second adhesive layer 402 may have a shape complementary to an uneven shape of the side of the protruding pattern CP in an area where the protruding portion 402b and the protruding pattern CP overlap each other in the B-direction DRB, but is not necessarily limited thereto. For example, the protruding portion 402b may cover a portion of the side and fill the other space except for a portion an upper portion of the space formed by the cut-out portion CG, and a portion, in which the second adhesive layer 402 is not filled, in the space formed by the cut-out portion CG may be filled by a third adhesive layer 403. In addition, the side of the protruding portion 402b and the side of the protruding pattern CP may be in direct contact with each other in most areas but the side of the protruding portion 402b and the side of the protruding pattern CP may be spaced apart from each other in some fine areas.

An upper surface of the protruding portion 402b disposed in the cut-out portion CG may be in direct contact with a lower surface of the third adhesive layer 403, and may have a planar shape like the lower surface of the third adhesive layer 403. Both the first adhesive layer 401 and the second adhesive layer 402 have an adhesive force, and the upper surface of the first adhesive layer 401 and a lower surface of the second adhesive layer 402 may be in direct contact with each other such that the first adhesive layer 401 and the second adhesive layer 402 may be adhered to each other.

In an embodiment, the second adhesive layer 402 may include the second coupling composition comprising an acrylic optical transparent adhesive (OCA). The second coupling composition of the second adhesive layer 402 may be different from the first coupling composition of the first adhesive layer 401. Therefore, the second adhesive layer 402 is optically transparent, whereby visibility of light emitted from the light emitting portion of the protruding pattern CP of the display panel 300 may be prevented from being reduced by being shielded by the second adhesive layer 402 disposed in the cut-out portion CG. In an embodiment, the second adhesive layer 402 may have a modulus in a range of about 0.2 Mpa to about 0.3 Mpa, but is not necessarily limited thereto. For example, in an embodiment the second adhesive layer 402 may have a modulus in a range of about 0.15 Mpa to about 0.35 Mpa depending on the acrylic optical transparent adhesive (OCA) included therein. The second adhesive layer 402 may have elasticity in accordance with the above modulus, and may serve to reduce strain applied to the corner portion depending on double refraction along with the first adhesive layer 401 and the protective member PROL, which are disposed below the second adhesive layer 402.

In an embodiment, the second coupling composition of the second adhesive layer 402 may have creep higher than that of the silicon-based optical transparent adhesive (OCA). Therefore, a creep characteristic of the second coupling composition of the second adhesive layer 402 may be greater than that of the first coupling composition of the first adhesive layer 401. In an embodiment, the second adhesive layer 402 may have a creep characteristic in a range of about 10% to about 40%, but is not necessarily limited thereto. For example, in some embodiments, the second adhesive layer 402 may represent a creep characteristic greater than or equal to about 40%.

When the protruding pattern CP and the cut-out portion CG are disposed on the second adhesive layer 402 due to the high creep characteristic of the second adhesive layer 402, the second adhesive layer 402 may be permeated into an empty space of the cut-out portion CG to fill the cut-out portion CG. In a lamination process of the display device 10, the pressure is applied to the display device 10 in the third direction (Z-axis direction), and the cover window CW and the display device 10 are fixed in a laminated state, whereby the second adhesive layer 402 may fill the space of the cut-out portion CG between the respective protruding patterns CP without a gap. As described above, as the silicon-based optical transparent adhesive (OCA) having a high creep characteristic is used for the second coupling composition of the second adhesive layer 402, an unfiled or lifting defect may be prevented from occurring due to bubbles that may be generated between the protruding patterns CP of the display panel 300. The creep refers to a phenomenon in which deformation of a material continues over time in a state where a constant stress is applied to the material.

The protruding pattern CP may be disposed on the base portion 402a of the second adhesive layer 402. The third display area DA3 includes protruding patterns CP and cut-out portions CG, which are formed by removing a portion of the display panel 300 through a photo process and an etching process. In an embodiment, in each of the cut-out portions CG, the substrate SUB, the pixel circuit layer PCL and the encapsulation layer TFEL may be removed by a photo process and an etching process, the second adhesive layer 402 may fill the corresponding space as described above, and each of the protruding patterns CP may include a substrate SUB, a pixel circuit layer PCL, a light emitting element layer EML and an encapsulation layer TFEL.

Since a third thin film transistor ST3 of the pixel circuit layer PCL, and a third pixel electrode 371, a third light emitting layer 372 and a third common electrode 373 of the third light emitting element 370 may be substantially the same as the first thin film transistor ST1 of the pixel circuit layer PCL and the first pixel electrode 171, the first light emitting layer 172 and the first common electrode 173 of the first light emitting element 170, which are described with reference to FIG. 7, a repeated description will be omitted for convenience of explanation. The first light emission area EA1' is illustrated in FIG. 11, and since the second light emission area EA2' and the third light emission area EA3' may be substantially the same as the first light emission area EA1' shown in FIG. 11, a repeated description will be omitted for convenience of explanation.

The second dam DAM2 may include a first sub dam SDAM1' formed of the same material as that of the second planarization layer 160, a second sub dam SDAM2' formed of the same material as that of the barrier layer 161, and a third sub dam SDAM3' formed of the same material as that of the bank 180. The second dam DAM2 may further include a fourth sub dam disposed on the third sub dam SDAM3'.

A dam hole DMH may be disposed inside the second dam DAM2. In an embodiment in which the third light emitting layer 372 is formed using the same mask as that of the third common electrode 373 in the third display area DA3, a structure for cutting the third light emitting layer 372 is required like the dam hole DMH.

The dam hole DMH may have an undercut shape. The undercut-shaped hole refers to a hole in which a size of an entrance is smaller than that of a bottom or a hole in which the size of the entrance is smaller than that of an area between the entrance and the bottom. The under cut-shaped hole may be similar to a jar shape or a shape of eaves of a roof. For example, the entrance of the dam hole DMH may be defined by the barrier layer 161. A lower surface of the barrier layer 161 disposed on the second planarization layer 160 may not be covered by the second planarization layer 160. As a result, the size of the entrance of the dam hole DMH may be smaller than that of the area between the entrance and the bottom of the dam hole DMH.

In an embodiment, a first floating pattern FP1, a second floating pattern FP2 and the first encapsulation inorganic layer 191 may be disposed in the dam hole DMH, and the encapsulation organic layer 192 may be filled in the dam hole DMH. At this time, a step coverage of the third light emitting layer 372 and the third common electrode 373 is not good. Therefore, when the dam hole DMH has an undercut shape, the third light emitting layer 372 and the third common electrode 373 may not be disposed on a sidewall of the dam hole DMH. Therefore, the third light emitting layer 372 and the third common electrode 373 may be disconnected from the dam hole DMH. The step coverage indicates that a film deposited by a predetermined deposition method is formed to be continuously connected even in a portion where a step difference is formed, like a stair.

The first floating pattern FP1 may be disposed on the second planarization layer 160 in the dam hole DMH. In an embodiment, the first floating pattern FP1 may be a residual layer of the third light emitting layer 372, which is disconnected from the third light emitting layer 372. In an embodiment, the first floating pattern FP1 may be made of the same material as that of the third light emitting layer 372. In some embodiments in which the size of the dam hole DMH is small, the first floating pattern FP1 may not be present.

The second floating pattern FP2 may be disposed on the first floating pattern FP1 of the dam hole DMH. The second floating pattern FP2 may be a residual layer of the third common electrode 373, which is disconnected from the third common electrode 373. In an embodiment, the second floating pattern FP2 may be made of the same material as that of the third common electrode 373. When the size of the dam hole DMH is small, the second floating pattern FP2 may not be present.

The encapsulation layer TFEL may be disposed on the light emitting element layer EML. The first encapsulation inorganic layer 191 may cover upper surfaces and sides of the second dam DAM2, the dam hole DMH and the light emitting layer EML and a side of the pixel circuit layer PCL. The encapsulation organic layer 192 may be disposed in a space defined by the second dam DAM2 on the first encapsulation inorganic layer 191. The encapsulation organic layer 192 may be disposed inside without departing from the space defined by the second dam DAM2 due to a structure of the dam hole DMH and the second dam DAM2 and surface tension of the encapsulation organic layer 192. The encapsulation organic layer 192 may be disposed on the light emitting layer EML so that a portion of the first encapsulation inorganic layer 191 or the second encapsulation inorganic layer 193 may be prevented from being punctured to prevent the light emitting layer EML from being damaged due to permeation of moisture or oxygen. The second encapsulation inorganic layer 193 may be disposed on the uppermost layer of the protruding pattern CP to cover the upper surface and the side of the protruding pattern CP.

The third adhesive layer 403 may be disposed on the second adhesive layer 402 and the protruding pattern CP. The lower surface of the third adhesive layer 403 may be in direct contact with the upper surface of the second adhesive layer 402 and the upper surface of the protruding pattern CP disposed in the cut-out portion CG. The upper surface of the third adhesive layer 403 may be in direct contact with the lower surface of the cover window CW, and may have the same size and shape as those of the lower surface of the cover window CW.

The upper and lower surfaces of the third adhesive layer 403 are shown in a straight line in a cross-sectional view, but are not necessarily limited thereto. For example, in an embodiment the second adhesive layer 402 disposed on the lower surface of the protruding pattern CP may fill most of the space of the cut-out portion CG and may not fill a portion of the upper portion of the cut-out portion CG, depending on a thickness of the cut-out portion CG. In this embodiment, a portion of the upper portion of the cut-out portion CG that is not filled with the second adhesive layer 402 is filled with the third adhesive layer 403, and the lower surface of the third adhesive layer 403 may have an uneven shape in which an area overlapped with the protruding pattern CP in the third direction (Z-axis direction) is a concave portion and an area overlapped with the protruding pattern CP is a convex portion. In addition, when the second adhesive layer 402 fully fills the cut-out portion CG due to the thin cut-out portion CG and is protruded above the protruding pattern CP, the lower surface of the third adhesive layer 403 may have an uneven shape in which an area overlapped with the protruding pattern CP in the third direction (Z-axis direction) is a convex portion and an area overlapped with the cut-out portion CG is a concave portion. In the cross-sectional view, the protruding pattern CP may be a forward tapered shape, and the protruding portion 402b may have a reverse tapered shape.

In an embodiment, the third adhesive layer 403 may include the same composition as that of the second adhesive layer 402. For example, the third adhesive layer 403 may include an acrylic optical transparent adhesive (OCA). Therefore, the third adhesive layer 403 is optically transparent, and the light emitted from the light emitting portion of the protruding pattern CP of the display panel 300 may be shielded by the third adhesive layer 403 to prevent visibility from being reduced. Also, the third adhesive layer 403 may serve to adhere the second adhesive layer 402 disposed therebelow and the protruding pattern CP to the cover window CW disposed thereon.

As described above, both the second adhesive layer 402 and the third adhesive layer 403 may include an acrylic optical transparent adhesive (OCA). The second adhesive layer 402 and the third adhesive layer 403 are in direct contact with each other in an area in which the second adhesive layer 402 and the third adhesive layer 403 are disposed to overlap the cut-out portion CG in the third direction (Z-axis direction). As both the second adhesive layer 402 and the third adhesive layer 403 include acrylic optical transparent adhesives (OCA) that are the same kinds, the second adhesive layer 402 and the third adhesive layer 403 may be easily cross-linked to each other at a boundary where both layers are in direct contact with each other. Therefore, the second adhesive layer 402 and the third adhesive layer 403 may have a high adhesive force in a portion where the second adhesive layer 402 and the third adhesive layer 403 are in direct contact with each other. Also, since second adhesive layer 402 and the third adhesive layer 403 have a similar molecular structure, the light incident on the boundary of both layers may be prevented from being refracted and/or reflected in a path different from that of the designed path.

The cover window CW may be disposed on the third adhesive layer 403.

The third adhesive layer 403, the second adhesive layer 402, the first adhesive layer 401 and the protective member PROL, which are disposed below the cover window CW, may all have elasticity so that strain applied to the corner portion having both the curvature of the left and right sides and the curvature of the upper and lower sides of the display device 10 may be reduced.

Figure 12:
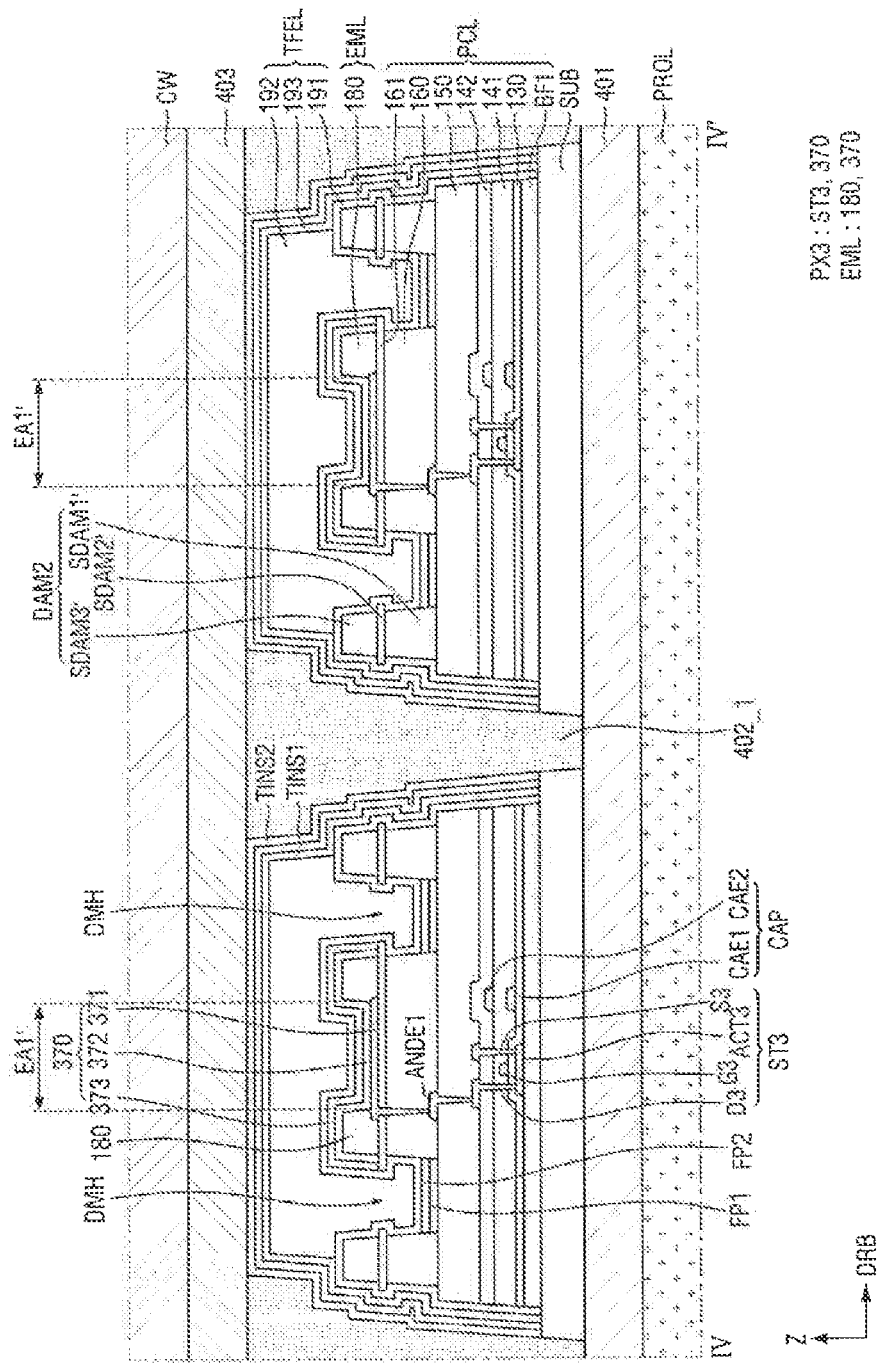
FIG. 12 is a cross-sectional view illustrating a display device taken along line IV-IV' of FIG. 10 according to an embodiment of the present disclosure.

FIG. 12 is a cross-sectional view illustrating a display device according to an embodiment, which is taken along the same line as IV-IV' of FIG. 10.

The display device 10 according to the present embodiment is different from an embodiment of FIG. 11 in that the first adhesive layer 401 is in direct contact with the lower surface of the protruding pattern CP and a second adhesive layer 402_1 is disposed only in the cut-out portion CG.

For example, the first adhesive layer 401 may be disposed on an upper surface of the protective member 401, the protruding pattern CP and the second adhesive layer 402_1 may be disposed on the upper surface of the first adhesive layer 401, a third adhesive layer 403 may be disposed on upper surfaces of the protruding pattern CP and the second adhesive layer 402_1, and a cover window CW may be disposed on an upper surface of the third adhesive layer 403.

Since the protective member PROL, the first adhesive layer 401, the protruding pattern CP, the third adhesive layer 403 and the cover window CW may be substantially the same as those of the embodiment of FIG. 11, a repeated description will be omitted for convenience of explanation.

In an embodiment, the second adhesive layer 402_1 may include an optical transparent resin (OCR). A manufacturing process of the display device 10 according to an embodiment shown in FIG. 12 may include steps of adhering the display panel 300 and the protective member PROL to each other through the first adhesive layer 401, applying the second adhesive layer 402_1 onto the cut-out portion CG of the display panel 300, and adhering the display panel 300 and the cover window CW to each other through the third adhesive layer 403.

In an embodiment, the step of applying the second adhesive layer 402_1 onto the cut-out portion CG of the display panel 300 may be a step of applying the second adhesive layer 402_1 onto the cut-out portion CG by using an inkjet, but is not necessarily limited thereto. For example, the second adhesive layer 402_1 may be applied onto the cut-out portions CG by using various equipment such as a dispenser or the like as well as ink jet.

The second adhesive layer 402_1 may have fluidity before being cured. Therefore, the second adhesive layer 402_1 applied onto the cut-out portion CG may have a structure complementary to the uneven structure of the side of the protruding pattern CP in spite of the uneven structure of the side of the cut-out portion CG, and may fully fill the cut-out portion CG, but is not necessarily limited thereto. For example, in an embodiment the second adhesive layer 402_1 may fill at least about 80% of the space formed by the cut-out portion CG.

The second adhesive layer 402_1 applied onto the cut-out portion CG may be cured by UV, and may adhere the first adhesive layer 401, the protruding pattern CP and the third adhesive layer 403, which are in direct contact with the second adhesive layer 402_1, to one another.

By adding a process of applying the second adhesive layer 402_1 onto the cut-out portion CG, an unfilled or lifting defect may be prevented from occurring, which is caused by bubbles generated between the protruding patterns CP of the display panel 300 because the cut-out portion CG is not fully filled with the adhesive layer.

In an embodiment, the second adhesive layer 402_1 may have a modulus in a range of about 30 kpa to about 50 kpa, but is not necessarily limited thereto. For example, in an embodiment, the second adhesive layer 402_1 may have a modulus in a range of about 20 kpa to about 70 kpa depending on the optical transparent resin (OCR) included therein. The second adhesive layer 402_1 may have elasticity in accordance with the above modulus, and may serve to reduce strain applied to the corner portion depending on double refraction along with the first adhesive layer 401 and the protective member PROL, which are disposed below the second adhesive layer 402_1.

Figure 13:
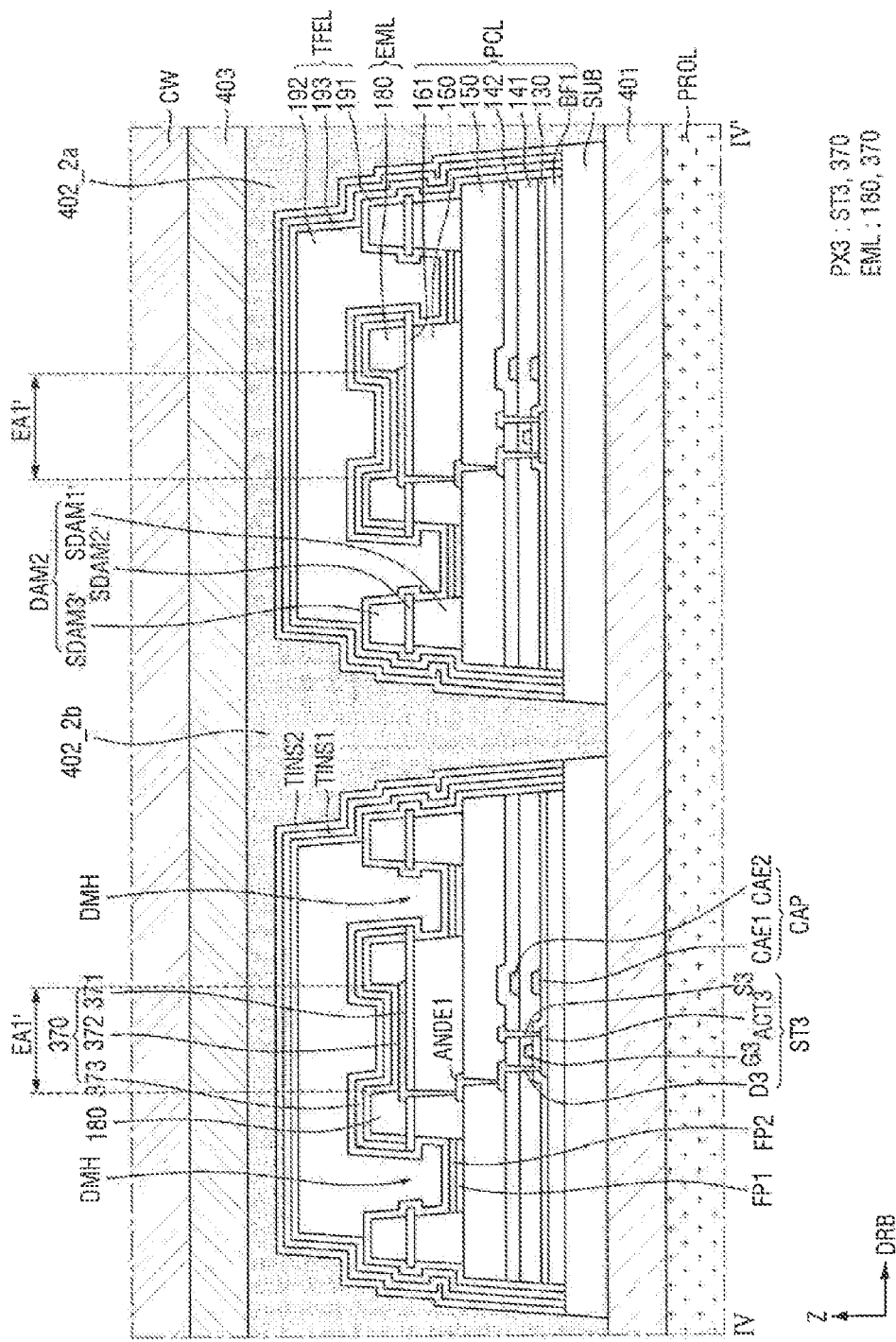
FIG. 13 is a cross-sectional view illustrating a display device taken along line IV-IV' of FIG. 10 according to an embodiment of the present disclosure.

FIG. 13 is a cross-sectional view illustrating a display device according to an embodiment, which is taken along the same line as IV-IV' of FIG. 10.

The display device 10 according to the present embodiment is different from the display device according to an embodiment of FIG. 12 in that a second adhesive layer 402_2 covers the upper surface of the protruding pattern CP so that the adhesive layer on the protruding pattern CP is formed as a double layer.

For example, a first adhesive layer 401 may be disposed on an upper surface of the protective member PROL, the protruding pattern CP may be disposed on the upper surface of the first adhesive layer 401, a second adhesive layer 402_2 may be disposed on an upper surface of the protruding pattern CP and the first adhesive layer 401, a third adhesive layer 403 may be disposed on an upper surface of the second adhesive layer 402_2, and a cover window CW may be disposed on an upper surface of the third adhesive layer 403. For example, an adhesive between the display panel 300 and the cover window CW may have a dual layer structure of the second adhesive layer 402_2 and the third adhesive layer 403.

Since physical properties of the second adhesive layer 402_2, the protective member PROL, the first adhesive layer 401, the protruding pattern CP, the third adhesive layer 403 and the cover window CW may be substantially the same as those of the embodiment of FIG. 11, a repeated description will be omitted for convenience of explanation.

In the second adhesive layer 402_2, a portion disposed between the upper surface of the protruding pattern CP and the third adhesive layer 403, having a flat shape is defined as a base portion 402_2a, and a portion disposed between the protruding patterns CP adjacent to each other inside the cut-out portion CG is defined as a protruding portion 402_2b. In an embodiment, the base portion 402_2a and the protruding portion 402_2b may be integrally formed without a separate interface in a portion where the base portion 402_2a and the protruding portion 402_2b are in direct contact with each other.

A side of the protruding portion 402_2b is in direct contact with the side of the protruding pattern CP, and may have a shape complementary to that of the side of the protruding pattern CP. Therefore, the protruding portion 402_2b may cover the side of the protruding pattern CP, and the base portion 402_2a may cover the upper surface of the protruding pattern Cp.

Due to a process error of the display device 10, a thickness of the protruding pattern CP may not be constant, and a thickness of the cut-out portion CG may not be constant. In the process of applying the second adhesive layer 402_2 onto the cut-out portion CP during the manufacturing process of the display device 10, a sufficient amount of the second adhesive layer 402_2 is applied onto the cut-out portion CP such that the second adhesive layer 402_2 fills the cut-out portion CG and covers the upper surface of the protruding pattern CP to form one layer on the protruding pattern CP, whereby a difference between levels of the second adhesive layers 402_2 filled in the respective cut-out portions CG may be prevented from occurring. Also, the third adhesive layer 403 disposed on the upper surface of the second adhesive layer 402_2 may be planarized to help increase visibility of the display device 10.

Figure 14:
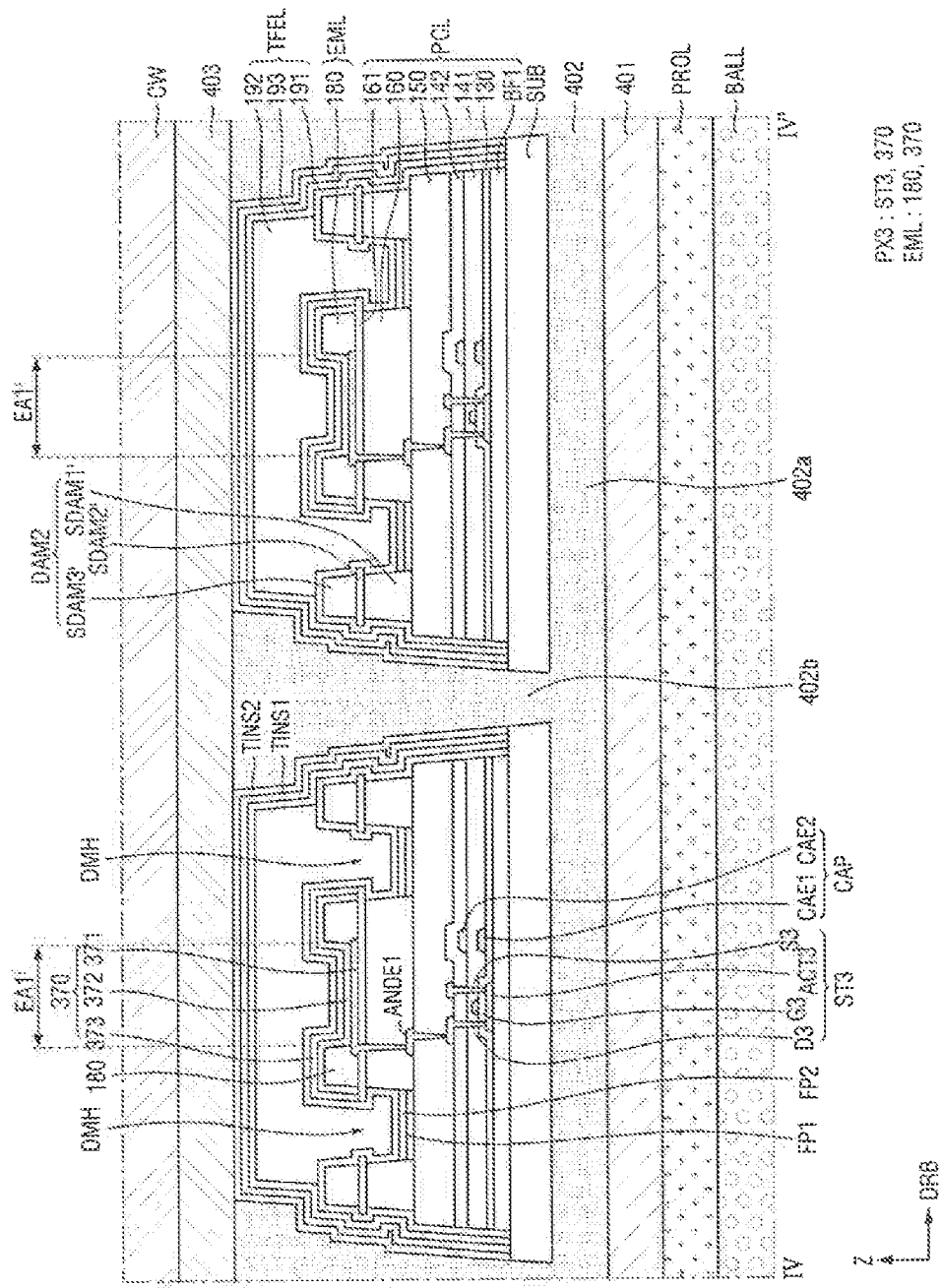
FIG. 14 is a cross-sectional view illustrating a display device taken along line IV-IV' of FIG. 10 according to an embodiment of the present disclosure.

FIG. 14 is a cross-sectional view illustrating a display device according to an embodiment, which is taken along the same line as IV-IV' of FIG. 10.

The display device 10 according to the present embodiment is different from the display device according to an embodiment of FIG. 11 in that a barrier layer BALL is additionally disposed on the lower surface of the display panel 300.

For example, the barrier layer BALL may be additionally disposed on the lower surface of the display panel 300. The barrier layer BALL may be entirely disposed on the lower surface of the display panel 300 corresponding to the first display area DA1, the second display area DA2 and the third display area DA3 at a uniform thickness, but is not necessarily limited thereto. For example, the barrier layer BALL may be entirely disposed on the lower surface of the display panel 300, or may be disposed only in an area corresponding to the corner portions CS1 to CS4 of the display panel 300 or disposed only on another specific portion below the display panel 300.

Although the barrier layer BALL is shown as being disposed on the lower surface of the protective member PROL, embodiments of the present disclosure are not necessarily limited thereto. For example, the barrier layer BALL may be disposed between the upper surface of the protective member PROL and the lower surface of the first adhesive layer 401, and may be disposed between the upper surface of the first adhesive layer 401 and the lower surface of the second adhesive layer 402. However, if the barrier layer BALL is disposed between the second adhesive layer 402 and the lower surface of the display panel 300, the second adhesive layer 402 cannot be permeated into the cut-out portion. Therefore, in an embodiment in which the second adhesive layer 402 is disposed on the lower surface of the display panel 300 as shown, the barrier layer BALL may not be disposed between the lower surface of the display panel 300 and the second adhesive layer 402.

In some embodiments, as shown in FIG. 12, when the second adhesive layer 402_1 is only disposed inside the cut-out portion without being disposed on the lower surface of the display panel 300, the barrier layer BALL may be disposed between the lower surface of the display panel 300 and the upper surface of the first adhesive layer 401.

In an embodiment, the barrier layer BALL may include a material, which does not transmit gases, such as nylon, polyvinylidene chloride (PVDC), polyglycolide (PGA), nanocomposite or aluminum. The barrier layer BALL may be adhered to the lower surface of the display panel 300 in the form of a film, or may be coated on the lower surface of the display panel 300 by using a coater.

The barrier layer BALL may block permeation of gases. Therefore, the barrier layer BALL may be disposed on the lower surface of the display panel 300, thereby preventing bubbles from being generated between the display panel 300 and the protective member PROL due to permeation of gases, which have transmitted the protective member PROL that is a polymer, into the lower surface of the display panel 300, and preventing delamination of the display panel 300 from occurring.

Features of various embodiments of the present disclosure may be combined partially or totally. As will be clearly appreciated by those skilled in the art, technically various interactions and operations are possible. Various embodiments can be practiced individually or in combination.

In concluding the detailed description, those skilled in the art will appreciate that many variations and modifications can be made to the described embodiments without substantially departing from the principles of the present disclosure. Therefore, the described embodiments of the present disclosure are used in a generic and descriptive sense only and not for purposes of limitation.

What is claimed is:

1. A display device comprising:
a display panel;
a protective member disposed below the display panel;
a first adhesive layer disposed on an upper surface of the protective member, the first adhesive layer including a first coupling composition; and
a second adhesive layer at least partially disposed between an upper surface of the first adhesive layer and a lower surface of the display panel, the second adhesive layer including a second coupling composition different from the first coupling composition,
wherein the second adhesive layer has a creep characteristic greater than that of the first adhesive layer, and
an adhesive force of the first coupling composition to the protective member is greater than an adhesive force of the second coupling composition to the protective member.

2. The display device of claim 1, wherein:
the display panel includes a first display area, a second display area disposed to surround the first display area, and a third display area including a plurality of protruding patterns disposed to be outwardly protruded from the second display area at a corner portion of the display device and a cut-out portion that is a space between the plurality of protruding patterns; and
the second adhesive layer includes a base portion disposed between the upper surface of the first adhesive layer and the lower surface of the display panel and a protruding portion connected from the base portion and protruded towards an upper side of the plurality of protruding patterns and passing through the cut-out portion.

3. The display device of claim 2, further comprising a third adhesive layer disposed on an upper surface of the display panel.

4. The display device of claim 3, wherein an upper end of the protruding portion is at least partially in direct contact with the third adhesive layer.

5. The display device of claim 4, wherein the third adhesive layer includes a third coupling composition that comprises a same material as the second coupling composition.

6. The display device of claim 3, further comprising a cover window disposed on an upper surface of the third adhesive layer.

7. The display device of claim 2, wherein the plurality of protruding patterns are separated from each other with the cut-out portion interposed therebetween.

8. The display device of claim 7, wherein a first side of a first protruding pattern that faces the cut-out portion among the plurality of protruding patterns is in direct contact with a first side of the protruding portion.

9. The display device of claim 8, wherein the first side of the first protruding pattern and the first side of the protruding portion have shapes that are complementary to each other.

10. The display device of claim 7, wherein a first side of a first protruding pattern that faces the cut-out portion among the plurality of protruding patterns has a forward tapered shape, and a first side of the protruding portion has a reverse tapered shape.

11. The display device of claim 1, wherein the protective member includes polydimethylsiloxane.

12. The display device of claim 11, wherein:
the first adhesive layer includes a silicon-based optical transparent adhesive and the second adhesive layer includes an acrylic optical transparent adhesive, and
the second adhesive layer has a modulus in a range of about 0.2 Mpa to about 0.3 Mpa and a creep characteristic in a range of about 10% to about 40%.

13. The display device of claim 1, further comprising a barrier layer disposed between the upper surface of the protective member and a lower surface of the second adhesive layer or on a lower surface of the protective member.

14. A display device comprising:
a display panel including a first display area, a second display area disposed to surround the first display area, and a third display area including a plurality of protruding patterns disposed to be outwardly protruded from the second display area at a corner portion of the display device and a cut-out portion that is a space between the plurality of protruding patterns;
a protective member disposed on a lower surface of the display panel;
a first adhesive layer disposed on an upper surface of the protective member;
a second adhesive layer disposed inside the cut-out portion;
a third adhesive layer disposed on an upper surface of the display panel; and a cover window disposed on an upper surface of the third adhesive layer, wherein the second adhesive layer is in direct contact with an upper surface of the first adhesive layer, sides of the plurality of protruding patterns and a lower surface of the third adhesive layer.

15. The display device of claim 14, wherein the protective member includes polydimethylsiloxane, the first adhesive layer includes a silicon-based optical transparent adhesive, and the second adhesive layer includes an optical transparent resin.

16. The display device of claim 14, wherein the second adhesive layer fills at least about 80% of space formed by the cut-out portion.

17. The display device of claim 14, further comprising a barrier layer disposed on the lower surface of the display panel.

18. A display device comprising:
a display panel including a first display area, a second display area disposed to surround the first display area, and a third display area including a plurality of protruding patterns disposed to be outwardly protruded from the second display area at a corner portion of the display device and a cut-out portion that is a space between the plurality of protruding patterns;
a protective member disposed on a lower surface of the display panel;
a first adhesive layer disposed on an upper surface of the protective member;
a second adhesive layer disposed on upper surfaces of the cut-out portion and the plurality of protruding patterns;
a third adhesive layer disposed on an upper surface of the second adhesive layer; and
a cover window disposed on an upper surface of the third adhesive layer,
wherein the second adhesive layer is in direct contact with an upper surface of the first adhesive layer, upper surfaces and sides of the protruding patterns and a lower surface of the third adhesive layer.

19. The display device of claim 18, wherein:
the second adhesive layer includes a base portion having a flat shape, disposed between the third adhesive layer and the plurality of protruding patterns, and a protruding portion disposed inside the cut-out portion;
the base portion and the protruding portion are integrally formed without a separate interface;
a adhesive layer disposed between the cover window and the display panel is comprised of a double layer of the base portion and the third adhesive layer; and
a first side of a first protruding pattern that faces the cut-out portion among the plurality of protruding patterns and a first side of the protruding portion that is in direct contact with the first side of the first protruding pattern have shapes that are complementary to each other.

20. The display device of claim 19, wherein the protective member includes polydimethylsiloxane, the first adhesive layer includes a silicon-based optical transparent adhesive, and the second adhesive layer includes an optical transparent resin.

\* \* \* \* \*